United States Patent [19]

Abe

[11] Patent Number: 5,646,562
[45] Date of Patent: Jul. 8, 1997

[54] PHASE SYNCHRONIZATION CIRCUIT, ONE-SHOT PULSE GENERATING CIRCUIT AND SIGNAL PROCESSING SYSTEM

[75] Inventor: Akira Abe, Suwa, Japan

[73] Assignee: Seiko Epson Corporation, Tokyo, Japan

[21] Appl. No.: 276,991

[22] Filed: Jul. 19, 1994

[30] Foreign Application Priority Data

Jul. 21, 1993 [JP] Japan ................................. 5-180391
Aug. 3, 1993 [JP] Japan ................................. 5-192544

[51] Int. Cl.$^6$ ................. H03L 7/093; H03L 7/087; H03L 7/099
[52] U.S. Cl. ................. 327/156; 327/159; 331/2; 331/17; 331/34
[58] Field of Search ................. 360/51, 45; 327/141, 327/155–157, 162, 172, 231, 233, 236, 243, 244, 227; 331/25, 2, 15, 17, 34

[56] References Cited

U.S. PATENT DOCUMENTS

| | | | |
|---|---|---|---|
| 4,516,084 | 5/1985 | Crowley | 331/2 |
| 4,567,448 | 1/1986 | Ikeda | 331/25 |
| 4,811,125 | 3/1989 | Sengoku | 360/51 |
| 5,021,749 | 6/1991 | Kasai et al. | |
| 5,038,115 | 8/1991 | Myers et al. | 331/2 |
| 5,072,195 | 12/1991 | Graham et al. | 331/2 |
| 5,075,639 | 12/1991 | Taya | 331/2 |
| 5,124,669 | 6/1992 | Palmer et al. | 331/25 |
| 5,206,769 | 4/1993 | Bailey et al. | 331/2 |
| 5,237,290 | 8/1993 | Banu et al. | 331/2 |
| 5,285,483 | 2/1994 | Ogawa et al. | |
| 5,293,275 | 3/1994 | Kawasaki | |
| 5,302,919 | 4/1994 | Abe | |
| 5,343,157 | 8/1994 | Masumoto et al. | 331/2 |

FOREIGN PATENT DOCUMENTS

| | | |
|---|---|---|
| 59-28209 | 2/1984 | Japan |
| 61-87416 | 5/1986 | Japan |

*Primary Examiner*—Timothy P. Callahan
*Assistant Examiner*—T. Lam
*Attorney, Agent, or Firm*—Oliff & Berridge

[57] ABSTRACT

First and second phase synchronization circuits include variable frequency oscillation circuits of the same structure. Operating point shift is performed by an operating point shift circuit, the output Vg of which is then inputted into an addition circuit. The oscillation frequency of the variable frequency oscillation circuits is con, rolled by the output Vf2 of the addition circuit. The signal Vf2 is also inputted into the terminal IN of a variable frequency oscillation circuit in a one-shot pulse generating circuit. The one-shot pulse width is determined by the signal Vf2 with the counts m of an edge detecting circuit. The one-shot pulse OS is inputted into a third phase synchronization circuit which in turn provides SYCLK and SYDT through a data standardizing circuit.

16 Claims, 30 Drawing Sheets

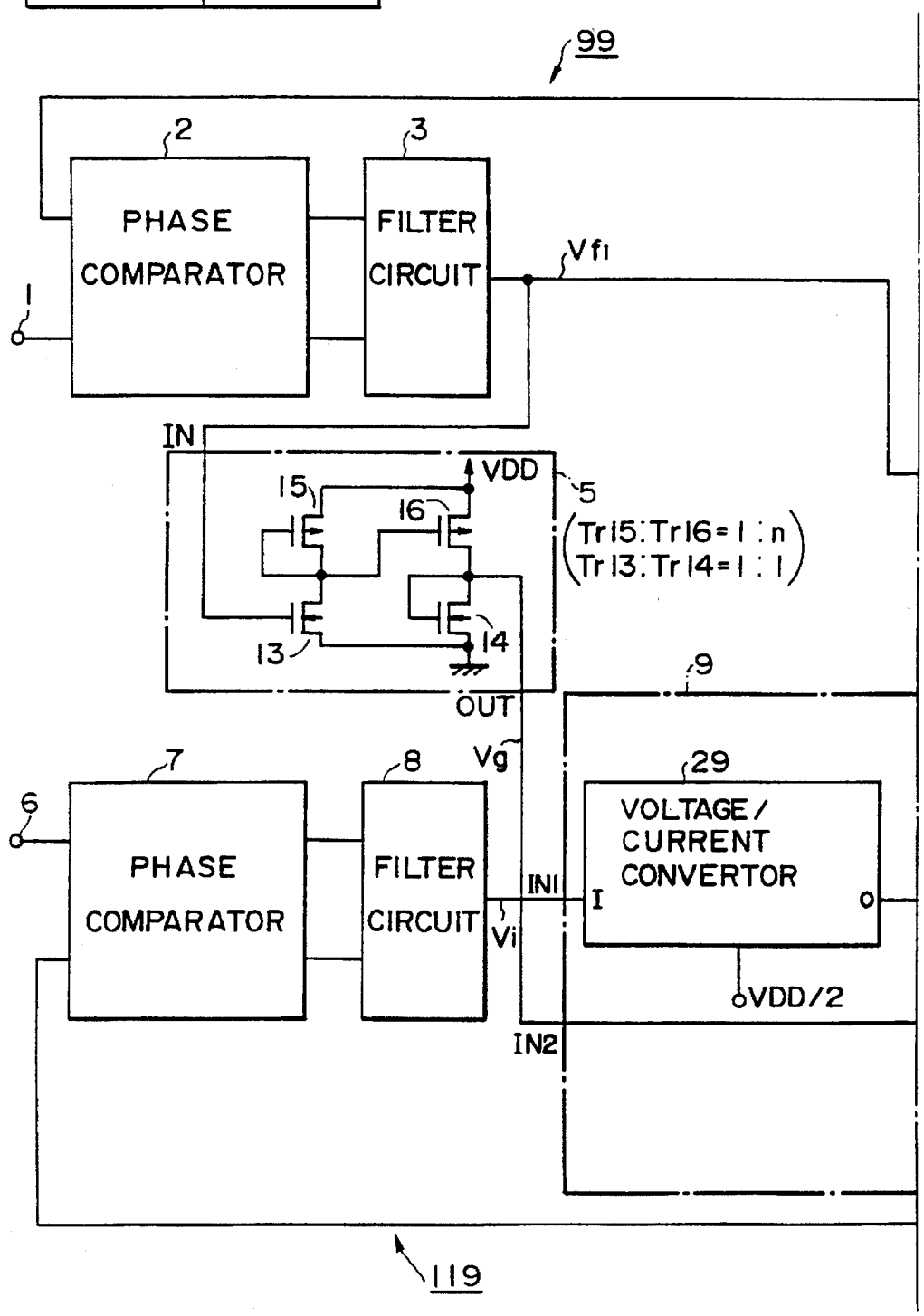

VOLTAGE/CURRENT CONVERTER

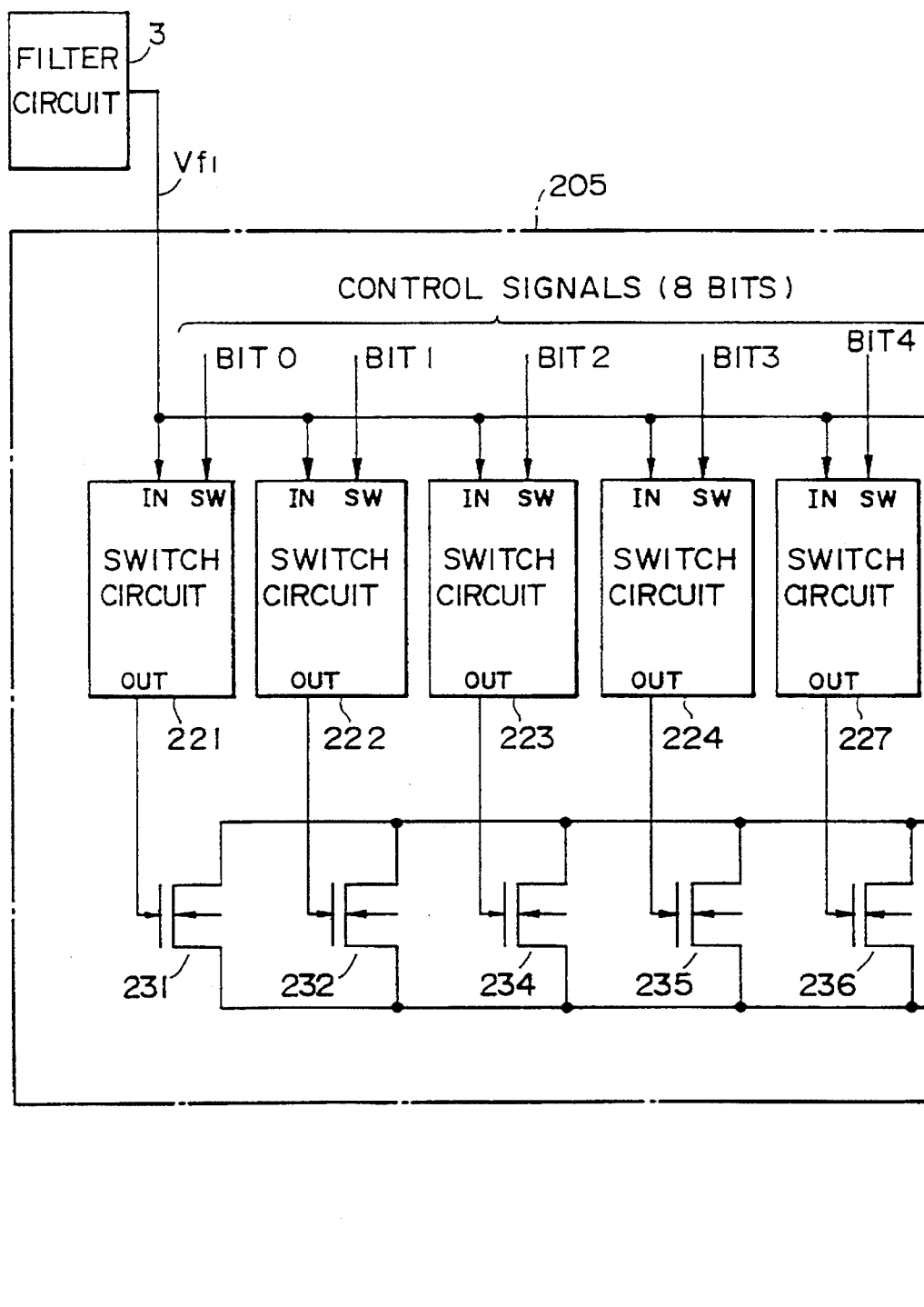

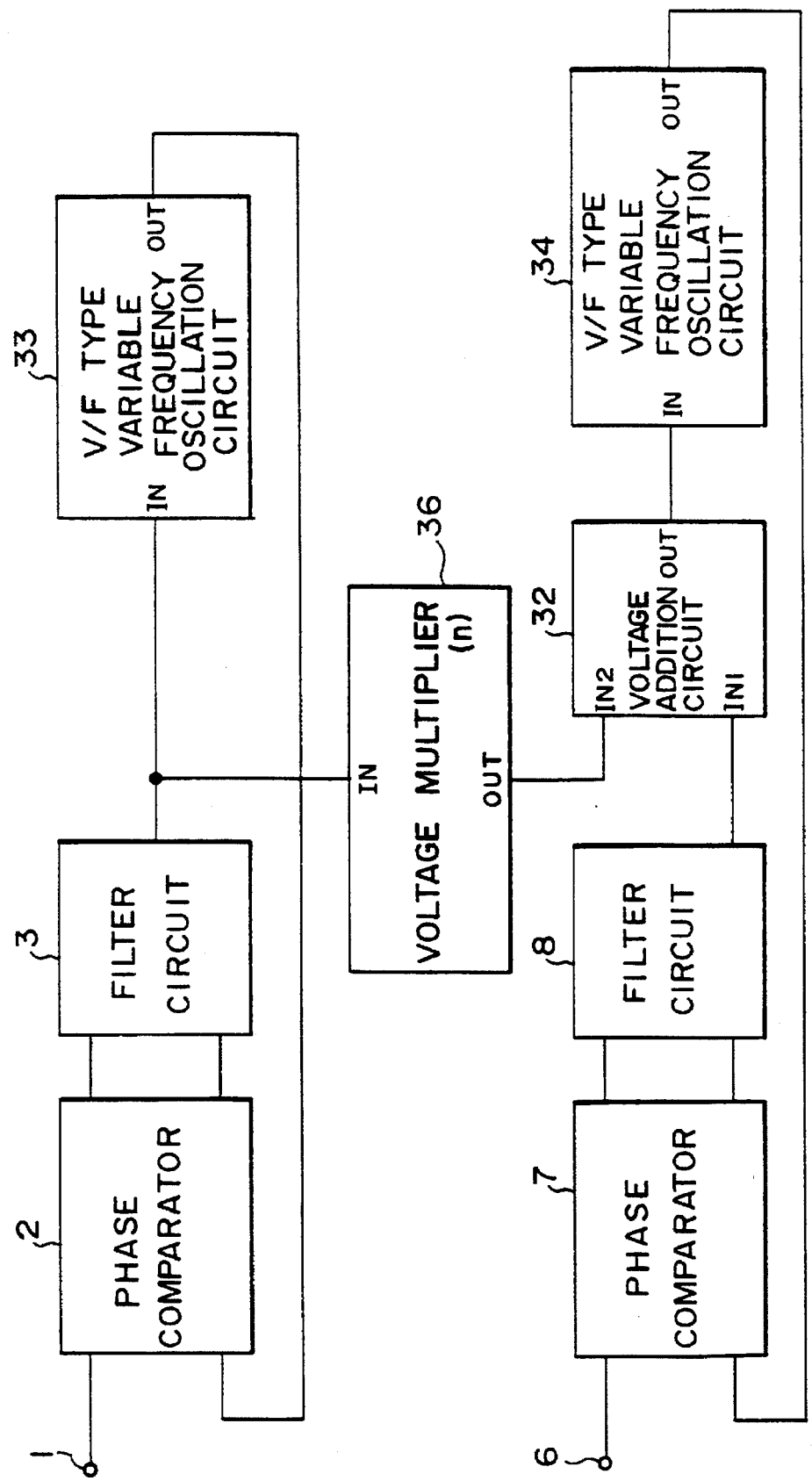

VOLTAGE MULTIPLIER

MULTIPLYING D/A CONVERTER

MULTIPLYING D/A CONVERTER WITH A SINGLE 5V POWER SUPPLY

VOLTAGE ADDITION CIRCUIT

VOLTAGE ADDITION CIRCUIT WITH A SINGLE 5V POWER SUPPLY

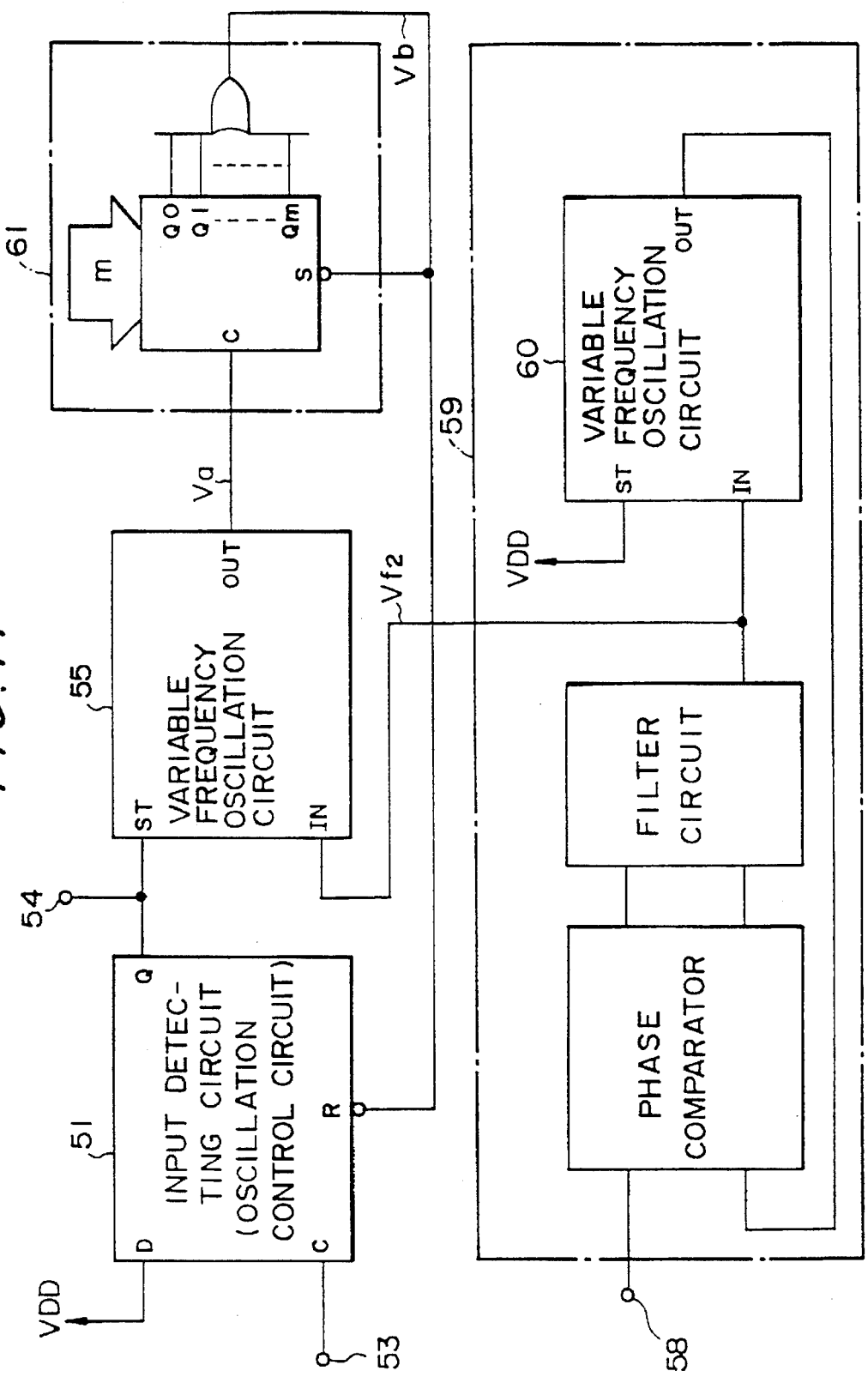

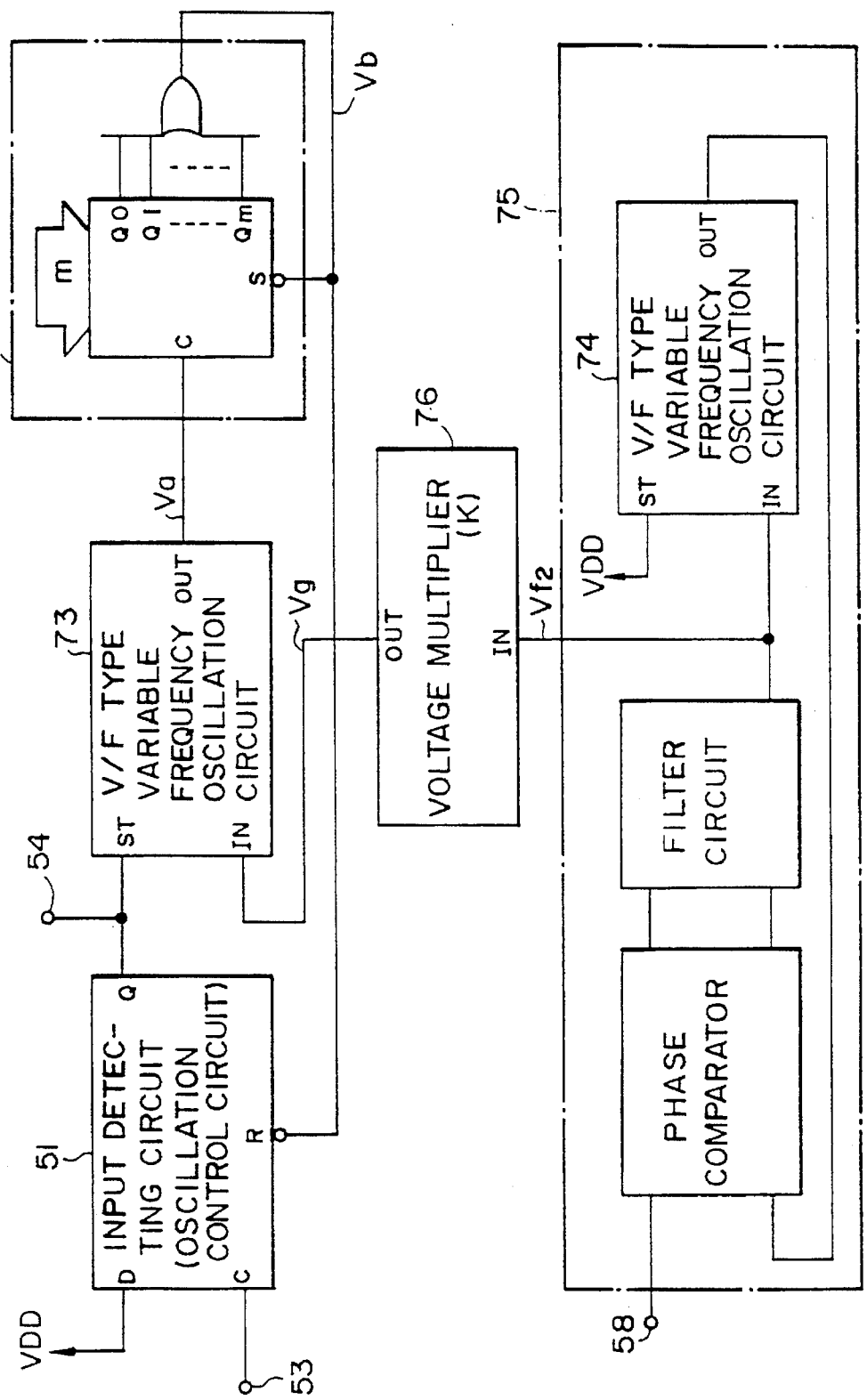

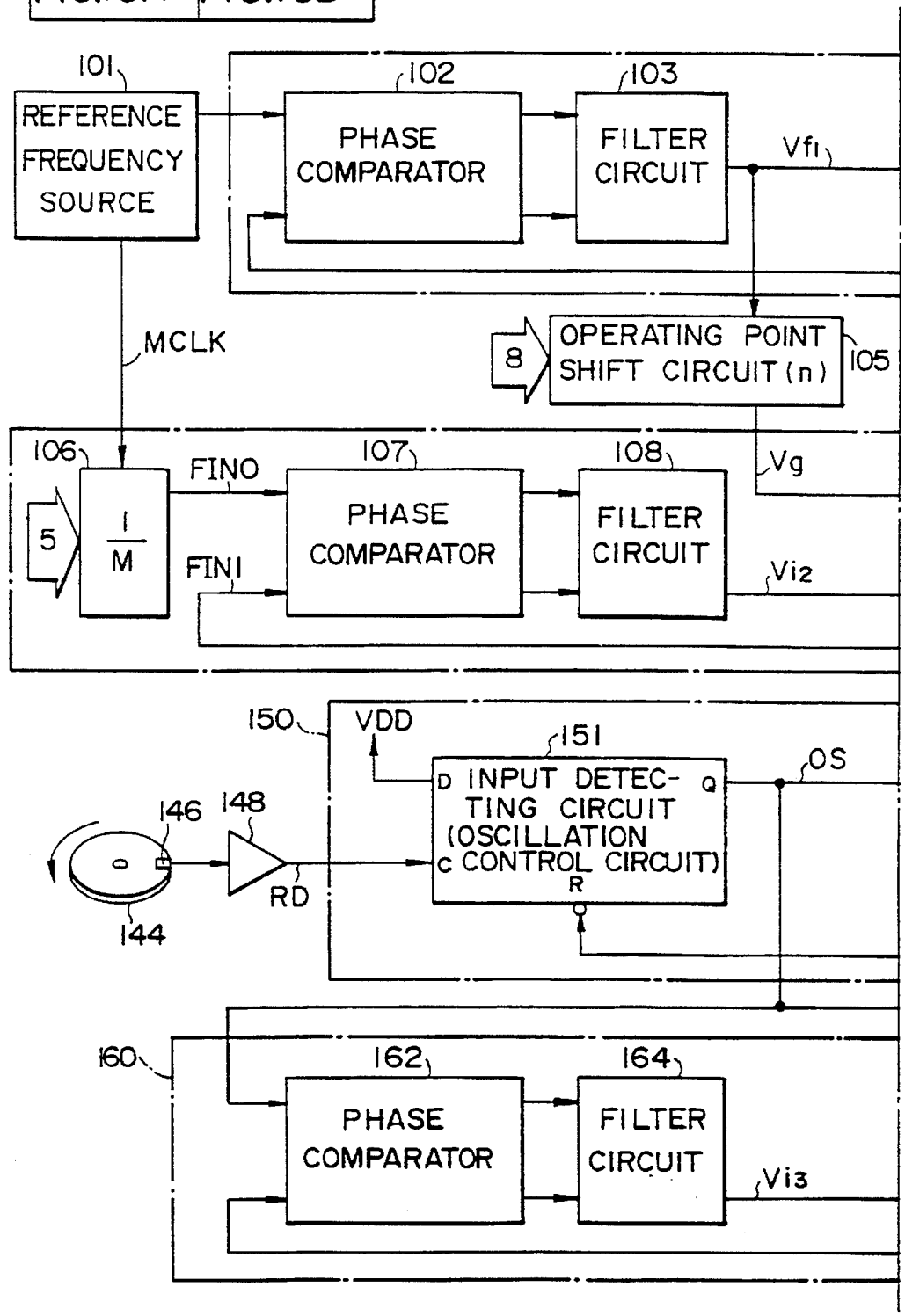

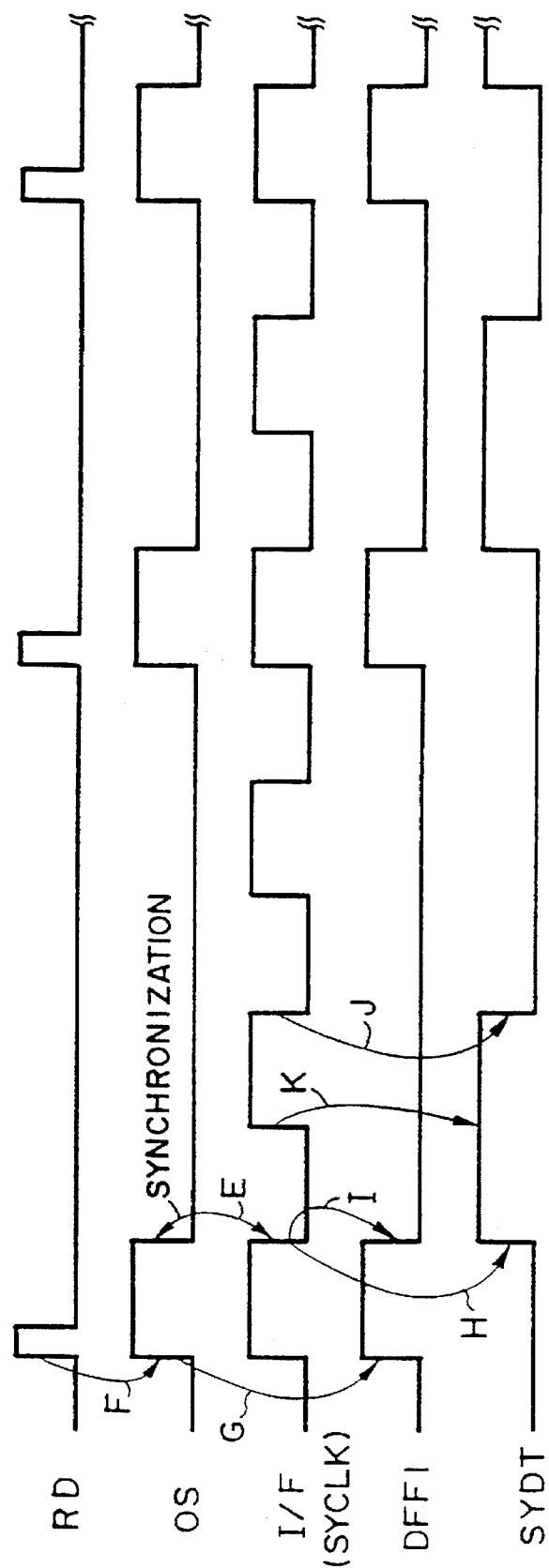

PHASE SYNCHRONIZATION CIRCUIT, ONE-SHOT PULSE GENERATING CIRCUIT AND SIGNAL PROCESSING SYSTEM

BACKGROUND OF THE INVENTION

1. Field of the Invention

The present invention relates to a phase synchronization circuit, a one-shot pulse generating circuit and a signal processing system including such phase synchronization circuit and one-shot pulse generating circuit.

2. Description of the Prior Art

In the zone bit recording process of the prior art for information storage media including hard discs, magneto-optial discs and other discs, the frequency of data write clocks varies depending on each zone which includes a plurality of tracks. In the four-zone bit recording, for example, the data write clocks have different frequencies, f1=8 MHz; f2=10 MHz; f3=12 MHz and f4=14 MHz. The zone bit recording process can provide substantially equal recording density for both the outermost and innermost peripheral zones by varying the frequency of the write clocks in the above manner, and thus increase the storage capacity of an information storage medium. When data in the information storage medium in which the writing has been performed according to the zone bit recording process is read out, the transfer rate of the read data corresponds to the write clock frequency of the respective zones. Therefore, a system for recording on or reproducing from such an information storage medium is required to generate clocks corresponding to the frequency of the respective zones, and also to reproduce data read out at the transfer rate corresponding to the frequency of the respective zones.

For example, in a phase synchronization circuit shown in FIG. 22, a phase comparator 307 receives a signal from 1/M frequency divider 302 which divides the reference frequency fm from reference frequency 301 source and a signal 1/N frequency divider 310 which divides the frequency fw of write clocks, and these signals are compared with each other (M and N are natural numbers). A DC voltage depending on the resulting phase difference is then outputted from a filter circuit 308 toward a variable frequency oscillation circuit 309, and controls an oscillation frequency. Thus, clocks corresponding to each zone and having a frequency fw=fm×(N/M) can be generated.

For example, Japanese Patent Application Laid-Open No. 59-28209 discloses a two-stage phase synchronization circuit which is provided with first and second phase synchronization circuits including voltage control type variable frequency oscillation circuits that have the same coefficient of voltage/frequency shift. The first phase synchronization circuit is synchronized with the reference frequency. The control voltage of the oscillation circuit in the first phase synchronization circuit is applied directly to the control input of the oscillation circuit in the second phase synchronization circuit. Thus, the free-running frequency of the second phase synchronization circuit becomes equal to the oscillation frequency of the oscillation circuit in the first phase synchronization circuit. According to the prior art, the free-running frequency of the second phase synchronization circuit is not influenced by variabilities in production, power supply voltage, ambient temperature and the other factors when the reference frequency is stable. Therefore, a high-precision and high-stability phase synchronization circuit could be realized without adjustment. Such prior art has been popular as it is extremely effective for unifying oscillation frequencies of oscillation circuits in a plurality of phase synchronization circuits.

In the case where data stored in the information storage medium are read out, the pulse width of the read data is variable. Therefore, it is necessary to provide a circuit called "one-shot pulse generating circuit" (which is referred simply to "one-shot circuit" hereafter) in order to generate pulses with constant width from the read data.

FIG. 23 shows a one-shot circuit constructed according to the prior art, which comprises an input detecting circuit 351 for first detecting the rising edge of an input signal inputted into the input terminal 353 thereof. The output of the input detecting circuit 351 is delayed for a certain time by a delay circuit 355, and the output 352 of the delay circuit 355 is inputted into the reset terminal of the input detecting circuit 351. Thus, the output terminal 354 of the input detecting circuit 351 generates a one-shot pulse.

Further, in the one-shot circuit of FIG. 23, a phase synchronization circuit 359 comprises a variable frequency oscillation circuit (ring oscillator) 360 having the same structure as that of the delay circuit 355 except that the circuit 360 has ring-connected inverters. A common oscillation control signal is inputted into the delay control terminal of the delay circuit 355 and also into the oscillation control terminal of the variable frequency oscillation circuit 360. Thus, the delay time of the delay circuit 355 can be determined depending on the reference frequency.

In such one-shot circuit, since the variable frequency oscillation circuit 360 has the same structure as that of the delay circuit 355 except that the circuit 360 has ring-connected inverters, errors in the delay time of the delay circuit 355 can be always compensated by the common oscillation control signal irrespective of variabilities in production, power supply voltage and ambient temperature. This provides one-shot pulses with improved stability and accuracy.

When the oscillation time pried of desired one-shot pulse width and that of said variable frequency oscillation circuit 360 are relatively close, and when the reference frequency is fixed, such art is technically effective and has been therefore used for one-shot circuits in the data separator for floppy discs.

A monostable multivibrator circuit, which is one example of the prior art one-shot circuits, is described in detail in Japanese Patent Application Laid-Open No. 61-97418.

However, the phase synchronization circuit having a structure as shown in FIG. 22 raises the following problems. Assuming that the range of variable clock frequency is between 10 MHz and 40 MHz, the range of oscillating voltage in the output Vf of the filter circuit 308 is limited, for example, between one volt and four volts in a single 5 V power supply. This requires the variable frequency oscillation circuit 309 to perform in such a way that the oscillation frequency is variable at least 10 MHz with the change in the output voltage Vf by one volt. Further, considering variabilities in production, power supply voltage, ambient temperature and other factors, such performance must be increased to two to three times so that the oscillation frequency is variable between 20 MHz and 30 MHz with the change in the output voltage Vf by one volt. Nevertheless, when the ratio of oscillation voltage to oscillation frequency (or oscillation current to oscillation frequency) in the variable frequency oscillation circuit 209 is too large, the circuit 309 is inclined to be unlocked or locked incorrectly in phase synchronization, or to increase the jitter due to noises or the like. Thus, the phase sychronization circuit of FIG. 22, has a problem of being unable to increase the variable range of write clocks greatly due to such limitations as inability to increase the above-identified ratio greatly and limits set on the range of oscillating voltage in the filter circuit.

The two-stage phase synchronization circuit shown in Japanese Patent Application Laid-Open No. 59-28209 also raises the following problems. When the oscillation frequency required by the zone bit recording process or the like in the phase synchronization circuit is different from that of the phase synchronization circuit synchronized with the reference frequency, the phase synchronization circuit cannot be used as far as its operational principle is concerned. This results from the fact that the oscillation control terminals cannot be connected to each other since the oscillation circuit differs in oscillation frequencies also differs in oscillation control voltages.

The prior art one-shot circuit shown in FIG. 23 further raises the following problems when the one-shot pulse width is much longer than the oscillation period of the variable frequency oscillation circuit 380, and when reference frequency should be varied in a wider range.

The prior art one-shot circuit set the desired one-shot pulse width by the delay time of the inverter in the delay circuit 355. To provide a longer one-shot pulse width, the number of delay inverter stages must be increased. This resulted in increasing the chip area and manufacturing cost. Further, although the delay circuit 355 is similar in structure to the variable frequency oscillation circuit 380 in the phase synchronization circuit, they are essentially different in functions and characteristics. Therefore, when a common oscillation control signal is inputted into the delay control terminal of the delay circuit 355 and also into the oscillation control terminal of the variable frequency oscillation circuit 360, the inverter delay time of the variable frequency oscillation circuit 360 is not completely identical to that of the delay circuit 355. Particularly, when the reference frequency is changed for controlling the delay time in a wide range, it is impossible to make the delay times of the circuit 355 and the circuit 360 equal within the entire frequency range.

When the relationship between the oscillation frequency of the variable frequency oscillation circuit 360 and the delay time of the delay circuit is changed, the delay characteristics of the delay circuit must be varied since the common oscillation control signal is used. As a result, the identical characteristics Between the variable frequency oscillation circuit 360 and the delay circuit 355 are further reduced.

SUMMARY OF THE INVENTION

To overcome the above-mentioned problems, it is one of the objects of the present invention to provide a phase synchronization circuit which can provide a desired oscillation frequency different from the reference frequency without being greatly affected by variabilities in production, power supply voltage, ambient temperature and other factors, and also to provide a signal processing system including such phase synchronization circuit.

Another object of the present invention is to provide a one-shot circuit which can provide a one-shot pulse having the desired pulse width in a wide range while suppressing increase of the occupied area, and also to provide a signal processing system including such one-shot circuit.

To this end, the present invention provides a phase synchronization circuit comprising first phase synchronization means synchronized with a reference frequency signal, second phase synchronization means synchronized with an input signal and an operating point shift means, said first phase synchronization means including first phase comparing means for performing the phase comparison for synchronization with said reference frequency signal, first filter means connected to said first phase comparing means for generating a first oscillation control signal, and first variable frequency oscillation means responsive to a current or voltage set by said first oscillation control signal for controlling the oscillation frequency thereof, said operating point shift means being responsive to said first oscillation control signal to generate an operating point shift signal which can be used to set a current or voltage n times of the current or voltage set by said first oscillation control signal, said second phase synchronization means including second phase comparing means for performing the phase comparison for synchronization with said input signal, second filter means connected to said second phase comparing means, adder means including first and second addition input terminals into which said operating point shift signal and the output of said second filter means are respectively inputted to generate a second oscillation control signal by the current or voltage addition, and a second variable frequency oscillation means responsive to a current or voltage set by said second oscillation control signal for controlling the oscillation frequency thereof.

According to the present invention, when the first phase synchronization means is synchronized with the reference frequency, the first oscillation control signal is outputted from the filter means toward the operating point shift means. The operating point shift means then generates an operating point shift signal which can be used to set a current or voltage n (real number) times of the current or voltage set by the first oscillation control signal. In other words, the operating point shift signal is a signal which can be used to increase the oscillation frequency from the first variable frequency oscillation means to n times. The operating point shift signal and the output of the second filter means are inputted into the first and second addition input terminals of the adder means to generate the second oscillation control signal by the current or voltage addition. The second oscillation control signal then controls the oscillation of the second variable frequency oscillation means. Thus, the second phase synchronization means can be caused to synchronize with an input signal which may be equal or substantially to n times the reference frequency, for example. As a result, a high-accuracy and high-stability phase synchronization circuit can be realized in a non-adjustment manner without affection of variabilities in production, power supply voltage, ambient temperature and other factors even if the desired oscillation frequency is different from the reference frequency. Particularly, where the shifting in the operating point shift means is to increase the current by n times, the operating point shift means can be simplified in structure.

The present invention is also characterized by that said operating point shift means includes control means for controlling said magnification n to any level.

According to the present invention, the control means can control the current or voltage set by the operating point shift signal so that it is multiplied by n. Thus, the center oscillation frequency of the second variable frequency oscillation means can be controlled to any level. This can realize a phase synchronization circuit which is optimum for the zone bit recording or the like. The present invention can effectively overcome any error resulting from I/F line that does not pass through the origin or is non-linear.

The present invention also provides a one-shot pulse generating circuit comprising input detecting means for detecting the presence or absence of an input signal, oscillation control means, first variable frequency oscillation means, edge detecting means and phase synchronization means having second variable frequency oscillation means of the same structure as that of said first variable frequency oscillation means and being synchronized with the reference frequency, said one-shot pulse generating circuit being operative to generate a one-shot pulse at the output terminal of said oscillation control means or first variable frequency oscillation means, said edge detecting means being operative to output a detection signal after the rising or falling edge of the output signal from the first variable frequency oscillation means has been counted m (natural number) times, said oscillation control means being operative to output an oscillation start signal toward the first variable frequency oscillation means when the input detecting means receives the input signal and to output an oscillation stop signal toward said first variable frequency oscillation means when said oscillation control means receives said detection signal from said edge detecting means, said first variable frequency oscillation means including an oscillation start/stop control terminal and an oscillation frequency control terminal, the oscillation being started when said oscillation start signal is inputted into said oscillation start/stop control terminal, the frequency of said oscillation being controlled in response to the oscillation control signal of said second variable frequency oscillation means inputted into said oscillation frequency control terminal, and when said oscillation stop signal is inputted into said oscillation start/stop control terminal, the oscillation can be stopped.

According to the present Invention, the oscillation control means controls to start the oscillation of the first variable frequency oscillation means when the input signal is detected by the input detecting means. Since the oscillation frequency is controlled in response to a signal for controlling the oscillation of the second variable frequency oscillation means, the oscillation frequency becomes equal to the reference frequency. The rising or falling edge of the oscillation output is counted by the edge detecting means. As the number of edges equal to m in number has been counted, a detection signal is outputted from the edge detecting means. The detection signal causes the oscillation control means to stop the oscillation. Thus, a one-shot pulse can be outputted with a width determined by the reference frequency and the counted number equal to m. Even where the desired one-shot pulse width is relatively large, a high-accuracy and high stability one-shot pulse output can be obtained in a wide range while suppressing increase of the occupied area. If the counted number m is equal to one, the function of the edge detecting means may be carried out by the input detecting means or the output of the first variable frequency oscillation means may be used as a one-shot pulse output.

The present invention is also characterized by operating point shift means being responsive to said oscillation control signal for generating an operating point shift signal capable of setting a current or voltage k times of the current or voltage set by the oscillation control signal of the second variable frequency oscillation means, the operating point shift signal being then outputted toward the oscillation frequency control terminal of the first variable frequency oscillation means.

According to the present invention, the oscillation frequency of the first variable frequency oscillation means can be equal or substantially equal to k times the reference frequency. The resolution on setting of the one-shot pulse width can be multiplied by k. As a result, the one-shot pulse width can be set with a finer resolution.

The present invention is further characterized by that the operating point shift means includes control means for controlling the magnification k to any level.

The control means can set the one-shot pulse width at my resolution. For example, this may provide a one-shot pulse having an accurate width appropriate to the zone bit recording process.

Even where the desired one-shot pulse width cannot be obtained since the oscillation cycle of the variable frequency oscillation means is not accurate immediately after the oscillation has been started, the magnification k can be controlled to provide a one-shot pulse of the desired width.

The present invention is further characterized by the adjustment of a window center by regulating the one-shot pulse width with the counted number m or a combination of the counted number m with the magnification k. In other words, the window margin on the plus side may be increased as by increasing the one-shot pulse width to shift the window center to the plus side. The window margin on the minus side may be increased as by decreasing the one-shot pulse width to shift the window center to the minus side. Thus, the window margin throughout the whole data reading system can be tested. Furthermore, where an information storage medium has a peak tending to shift rightward or leftward, the one-shot pulse width may be varied to adjust the window center position, depending on the characteristics of that information storage medium. This can effectively prevent any erroneous read-out of data.

The present invention further provides a signal processing system comprising first phase synchronization means synchronized with a reference frequency signal, second phase synchronization means synchronized with a clock signal set on the reference frequency signal, first operating point shift means, one-shot pulse generating means including input detecting means for detecting the presence or absence of data read out from an information medium oscillation control mess, fourth variable frequency oscillation means and edge detecting means, and third phase synchronization means for data separator.

said first phase synchronization means comprising first phase comparing means for performing the phase comparison for synchronization with the reference frequency signal, first filter means connected to the first phase comparing means for generating a first oscillation control signal, and first variable frequency oscillation means responsive to a current or voltage set by the first oscillation control signal to control the oscillation frequency thereof, said first operating point shift means being responsive to said first oscillation control signal to generate a first operating point shift signal capable of setting a current or voltage n times of the current or voltage set by the first oscillation control signal, said second phase synchronization means comprising second phase comparing means for performing the phase comparison for synchronization with the clock signal second filter means connected to the second phase comparing means, adder means including first and second addition input terminals into which the first operating point shift signal and the output of the second filter means are respectively inputted to generate a second oscillation control signal by the current or voltage addition, and second variable frequency oscillation means responsive to the current or voltage set by the second oscillation control signal to control the oscillation frequency thereof, said edge detecting means included in said one-shot pulse generating means being operative to output a detection signal after the rising or falling edge of the output signal from the fourth variable frequency oscillation means has been counted m times, said oscillation control means included in said one-shot pulse generating means being operative to output an oscillation start signal toward the fourth variable frequency oscillation means when the read data is detected by the input detecting means and also to output an oscillation stop signal toward the fourth variable frequency oscillation means when the detection signal is inputted into the oscillation control means from the edge detecting means, the fourth variable frequency oscillation means included in said one-shot pulse generating means having an oscillation start/stop control terminal and an oscillation frequency control terminal, the oscillation being started when the oscillation start signal is inputted into the oscillation start/stop control terminal, the frequency of said oscillation being controlled in responsive to the second oscillation control signal of the second variable frequency oscillation means inputted into the oscillation frequency control terminal, and the oscillation being stopped when the oscillation stop signal is inputted into the oscillation start/stop control terminal, the third phase synchronization means for data separator comprising third phase comparing means for performing the phase comparison for synchronization with the one-shot pulse output of said one-shot pulse generating means, third filter means connected to the third phase comparing means, adder means including first and second addition input terminals into which the second oscillation control signal and the output of the third filter means are respectively inputted to generate a third oscillation control signal by the current or voltage addition, third variable frequency oscillation means for controlling the oscillation frequency thereof in response to a current or voltage set by the third oscillation control signal, and data standardizing means.

According to the present invention, the read data is detected by the one-shot pulse generating means which in turn outputs a one-shot pulse having a width determined by the second oscillation control signal and the counted number m. In such a case, the second oscillation control signal is a signal obtained by shifting the operating point of the first oscillation control signal of the first phase synchronization means through the operating point shift means and performing the current or voltage addition through the adder means. Therefore, the fourth variable frequency oscillation means will oscillate at the same frequency as that of the second variable frequency oscillation means. The one-shot pulse output of the one-shot pulse generating means is then inputted into the third phase synchronization means being a data separator which is in turn synchronized with this one-shot pulse. At this time, the center oscillation frequency in the third variable frequency oscillation means is determined by the second oscillation control signal. A data standardizing circuit outputs the standardized read-out data and clocks in response to the one-shot pulse output and also the output of the third variable frequency oscillation means. According to the present invention, therefore, the standardized read-out data and clocks can be reproduced from the data read out from the information storage medium.

Furthermore, the output clocks of the second phase synchronization circuit can be used to generate data write clocks to the information storage medium.

BRIEF DESCRIPTION OF THE ACCOMPANYING DRAWINGS

FIG. 1 is a block diagram of a phase synchronization circuit constructed in accordance with a first embodiment of the present invention.

FIGS. 2(a) and 2(b) is a view showing the details of the circuits in FIG. 1.

Figure 6B:
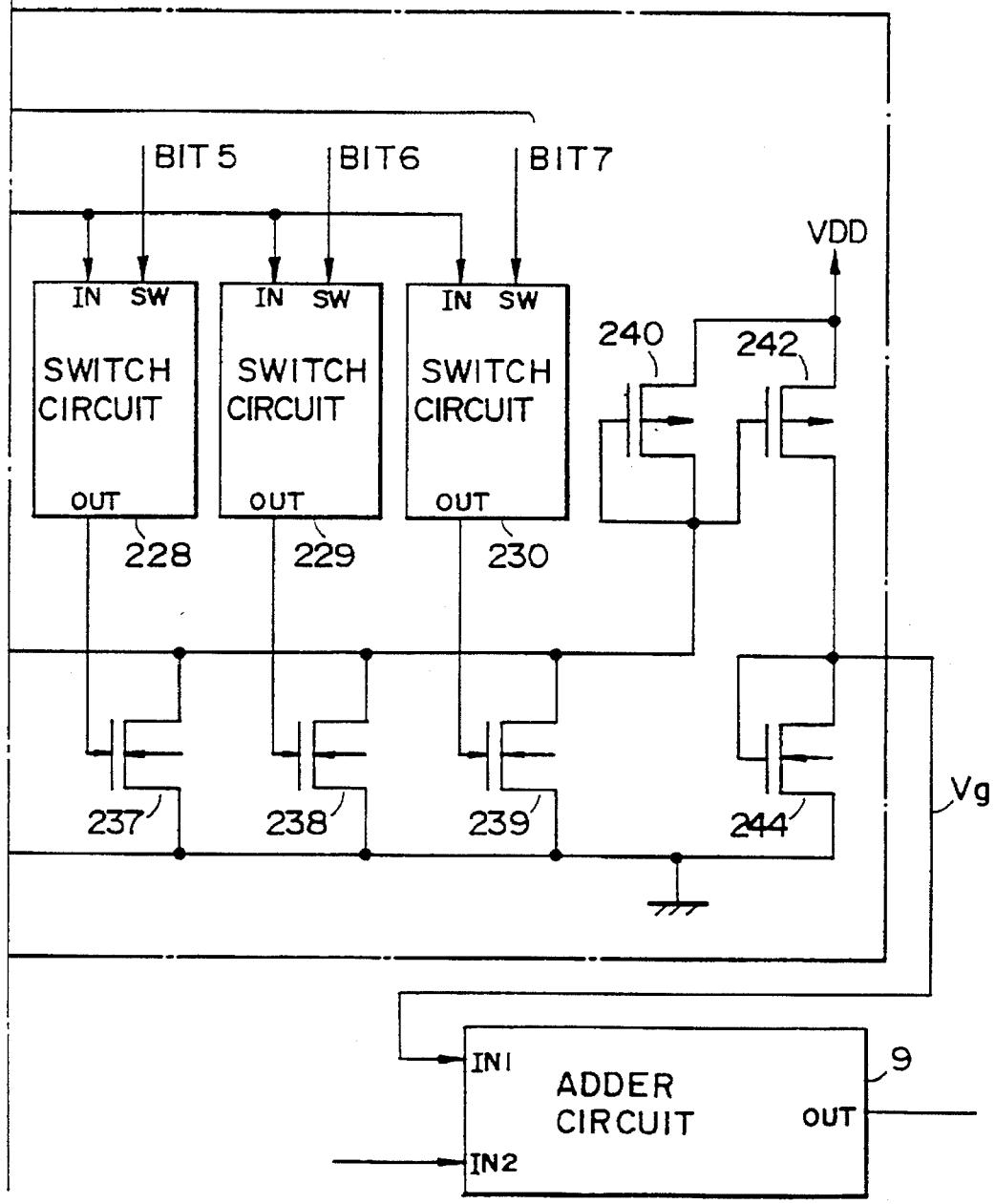

FIGS. 6(a) and 6(b) shows still another operating point shift circuit having means for controlling the magnification n at any level.

Figure 7:
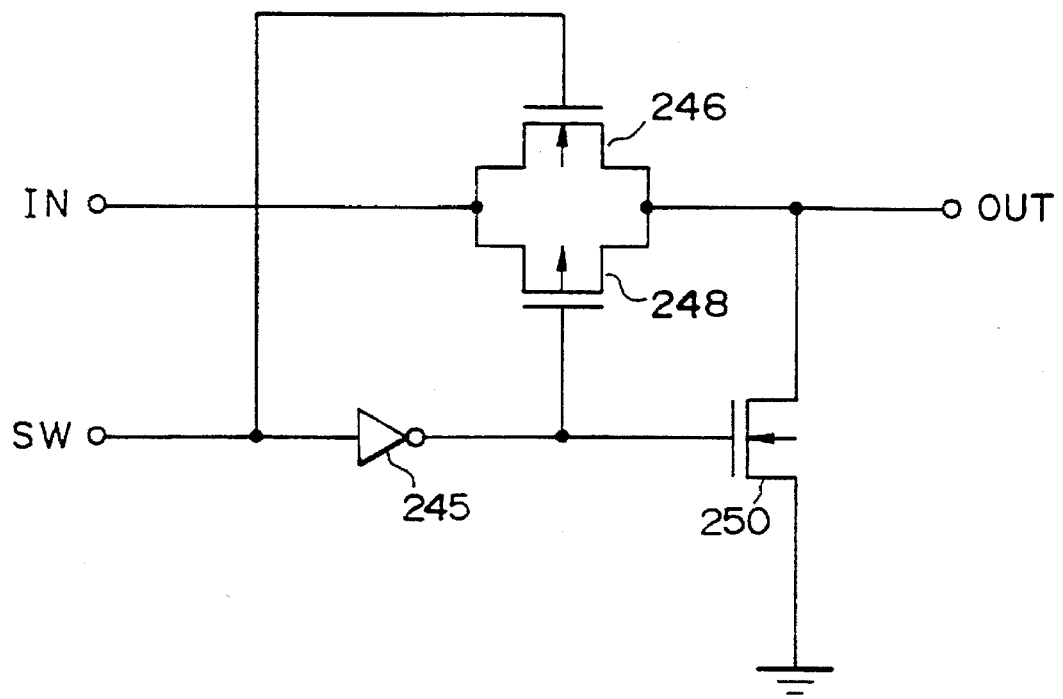

FIG. 7 shows an example of a switch circuit.

Figure 8B:
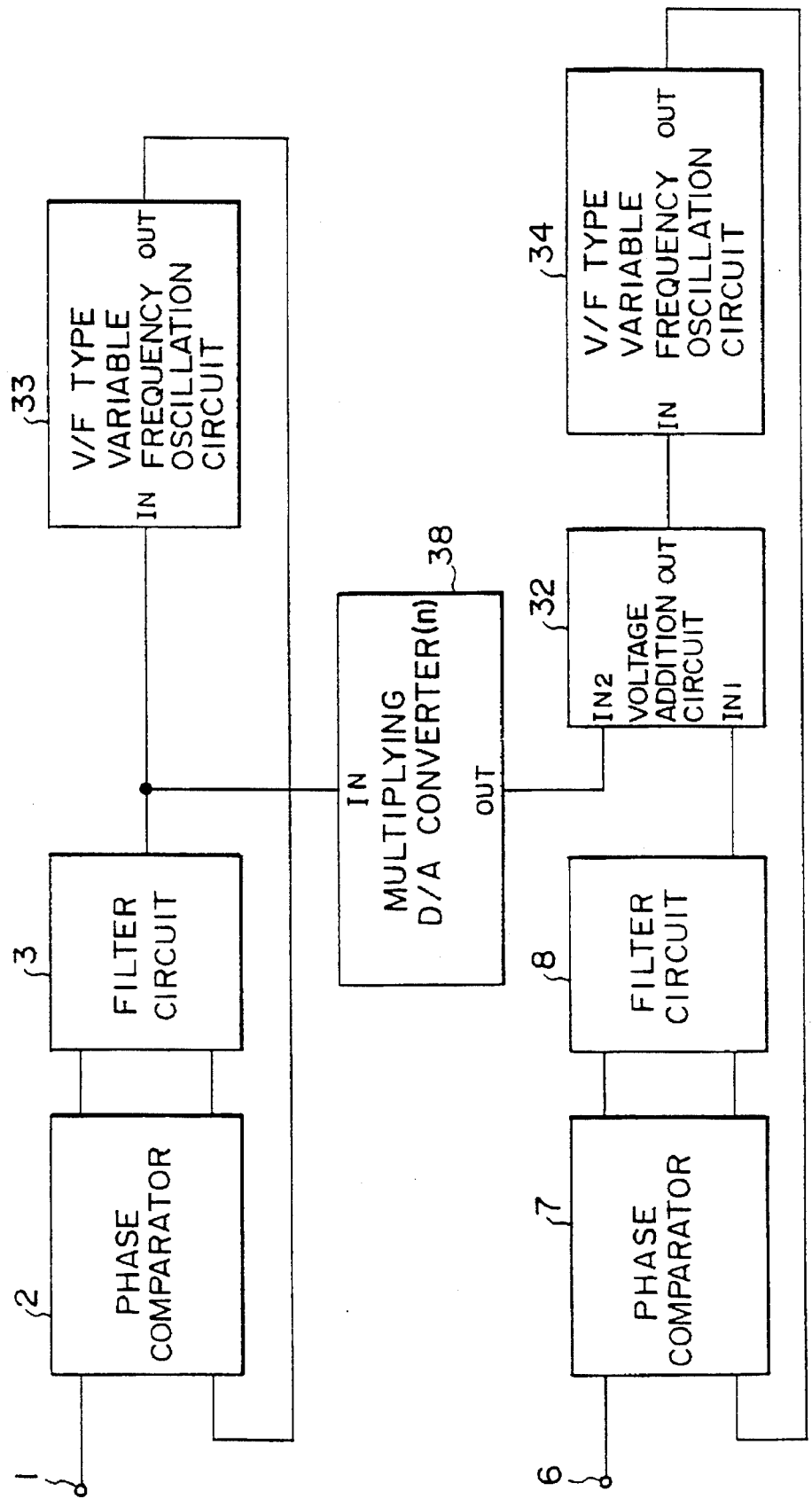

FIGS. 8A and 8B show examples of a phase synchronization circuit using a V/F type variable frequency oscillation circuit.

Figure 9A:
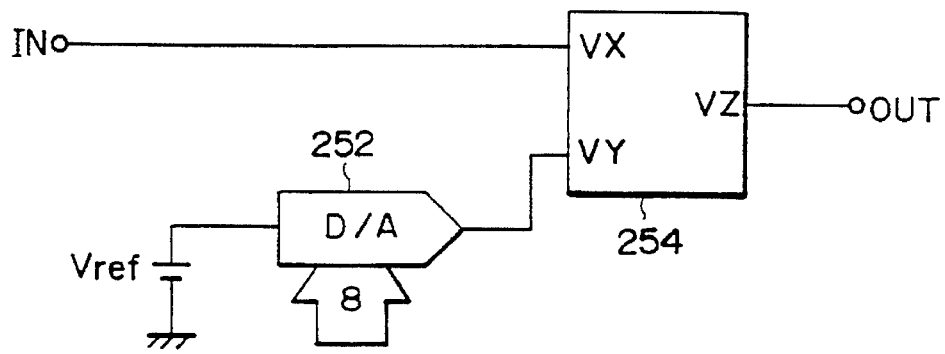
Figure 9B:
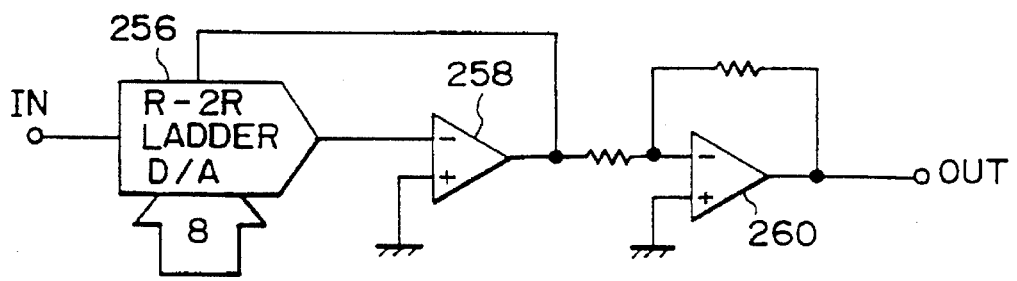
Figure 9C:
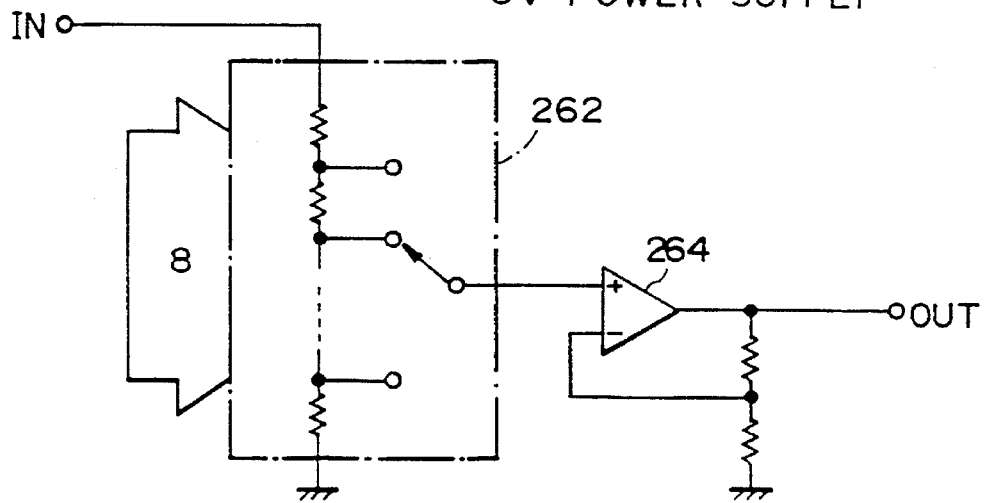

FIGS. 9A, 9B and 9C show examples of a voltage multiplier and two multiplying D/A converters, respectively.

Figure 10A:
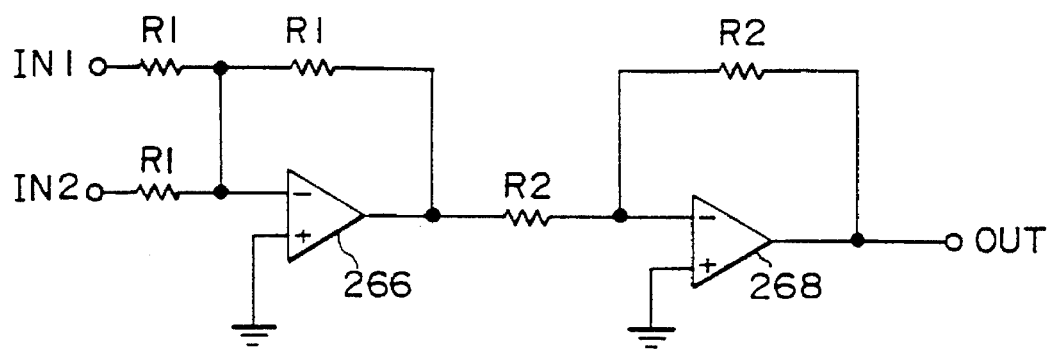
Figure 10B:
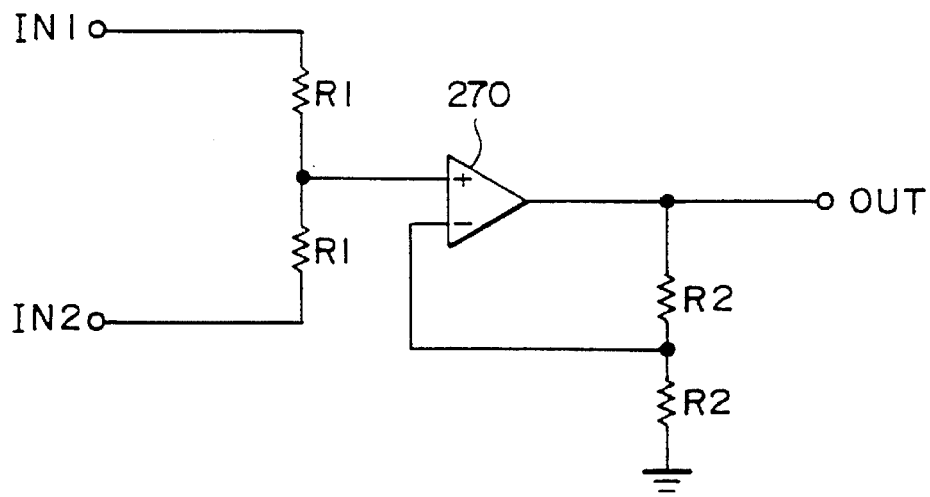

FIGS. 10A and 10B show examples of voltage addition circuits.

FIG. 11 is a block diagram of a one-shot circuit according to the second embodiment of the present invention.

Figure 12:
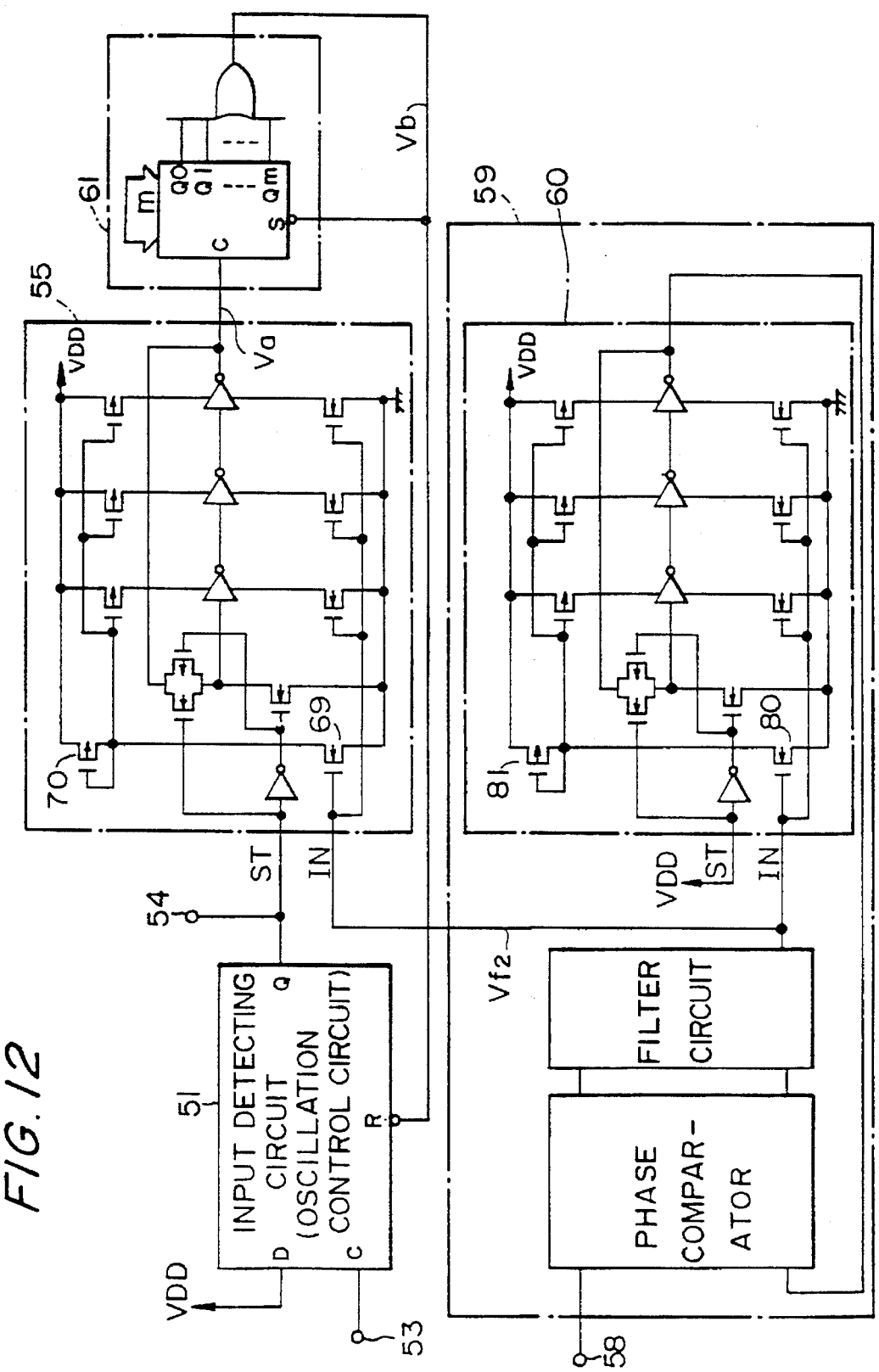

FIG. 12 is a view showing the details of the one-shot circuit shown in FIG. 11.

Figure 13:
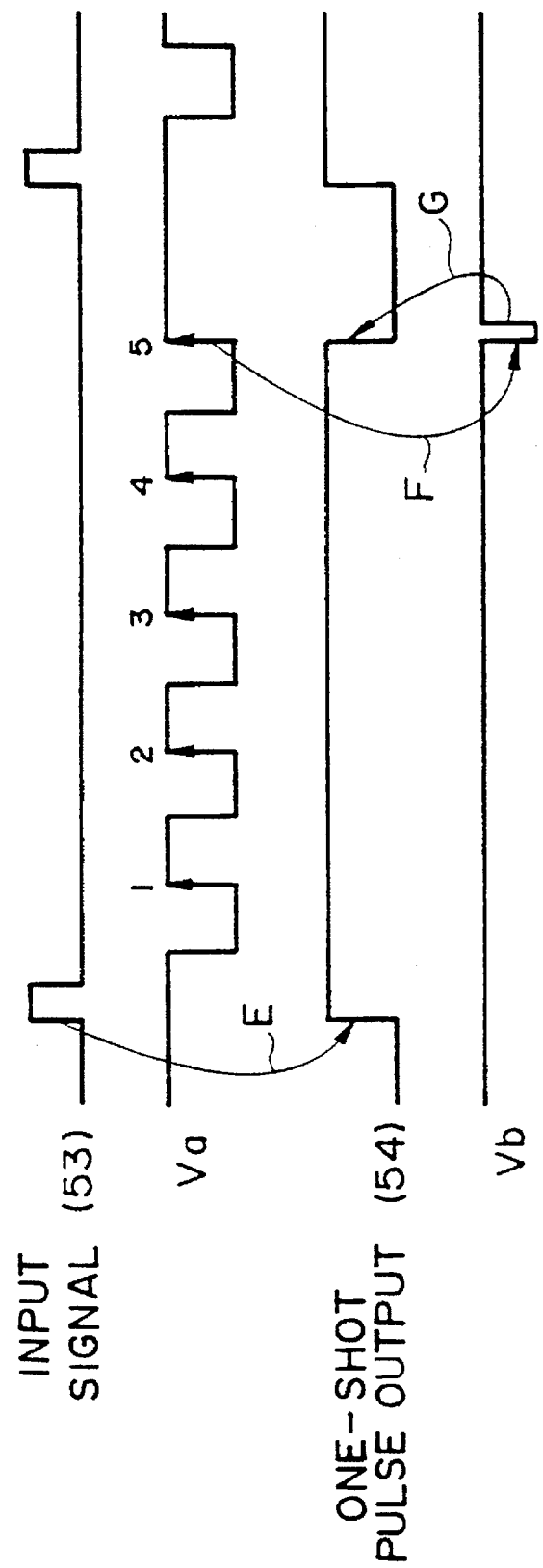

FIG. 13 is a timing chart illustrating the operation of the one-shot circuit.

Figure 14:
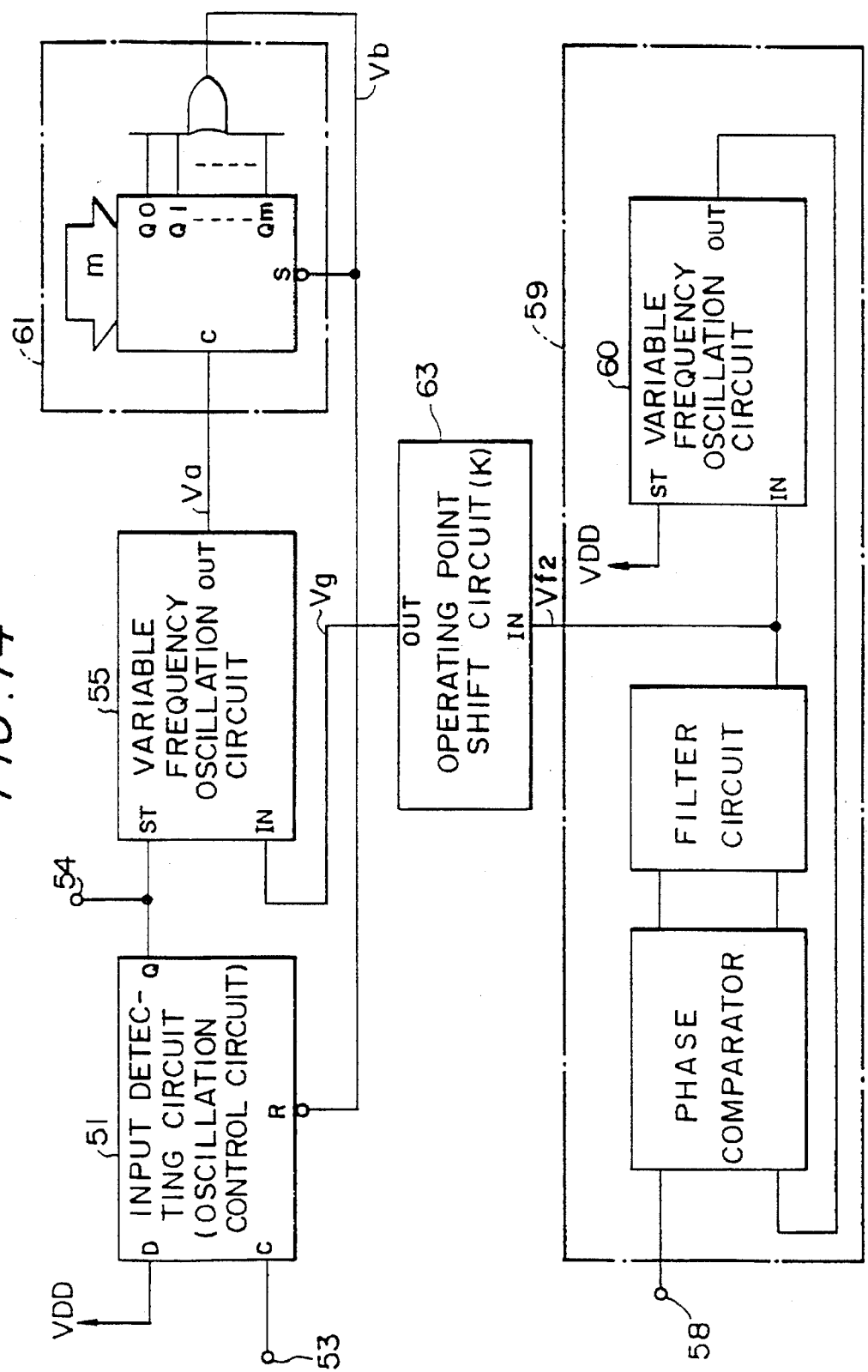

FIG. 14 shows an example of a one-shot circuit including an operating point shift circuit.

Figure 15B:
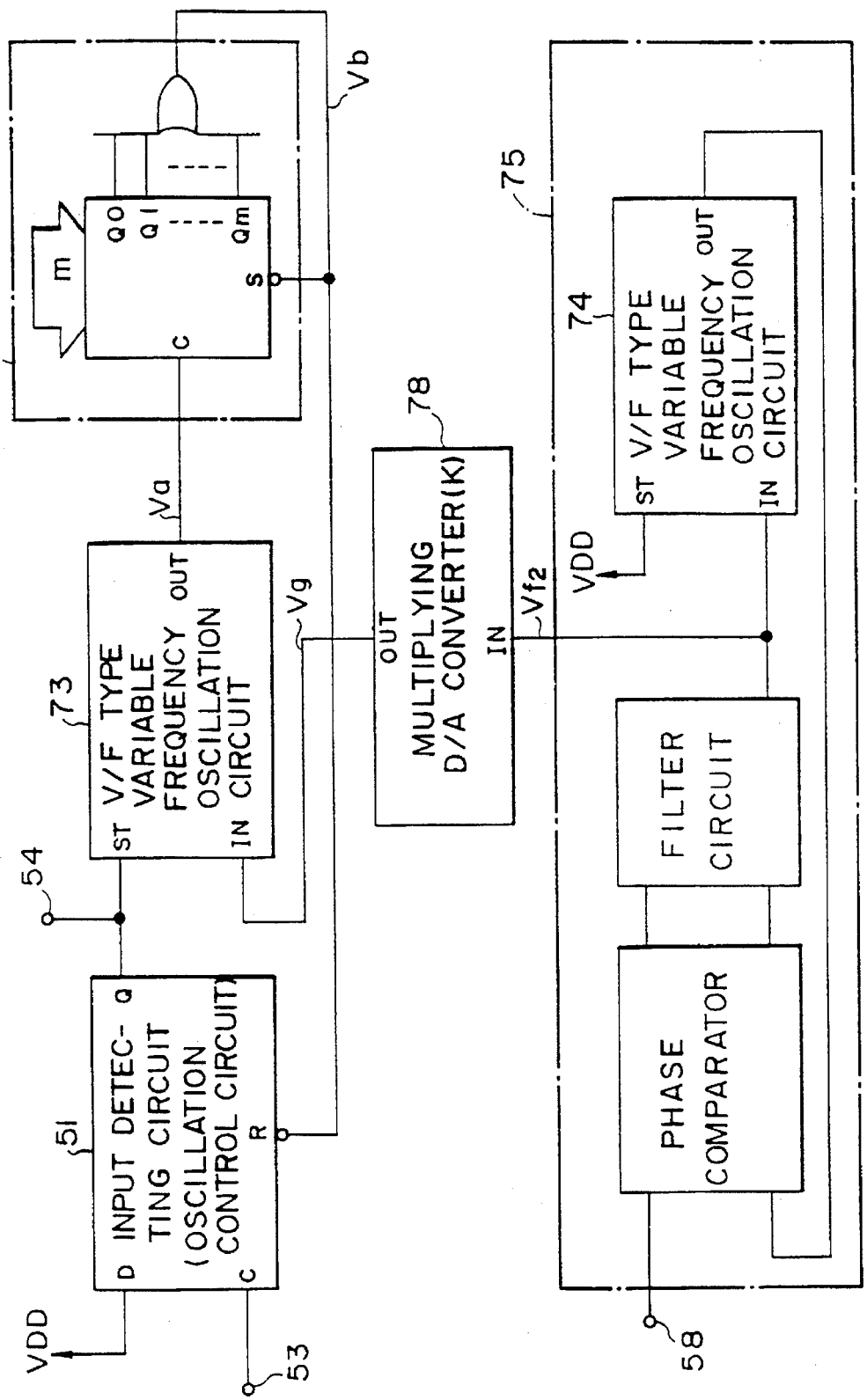

FIGS. 15A and 15B show examples of one-shot circuits each using a V/F type variable frequency oscillation circuit.

Figure 16B:
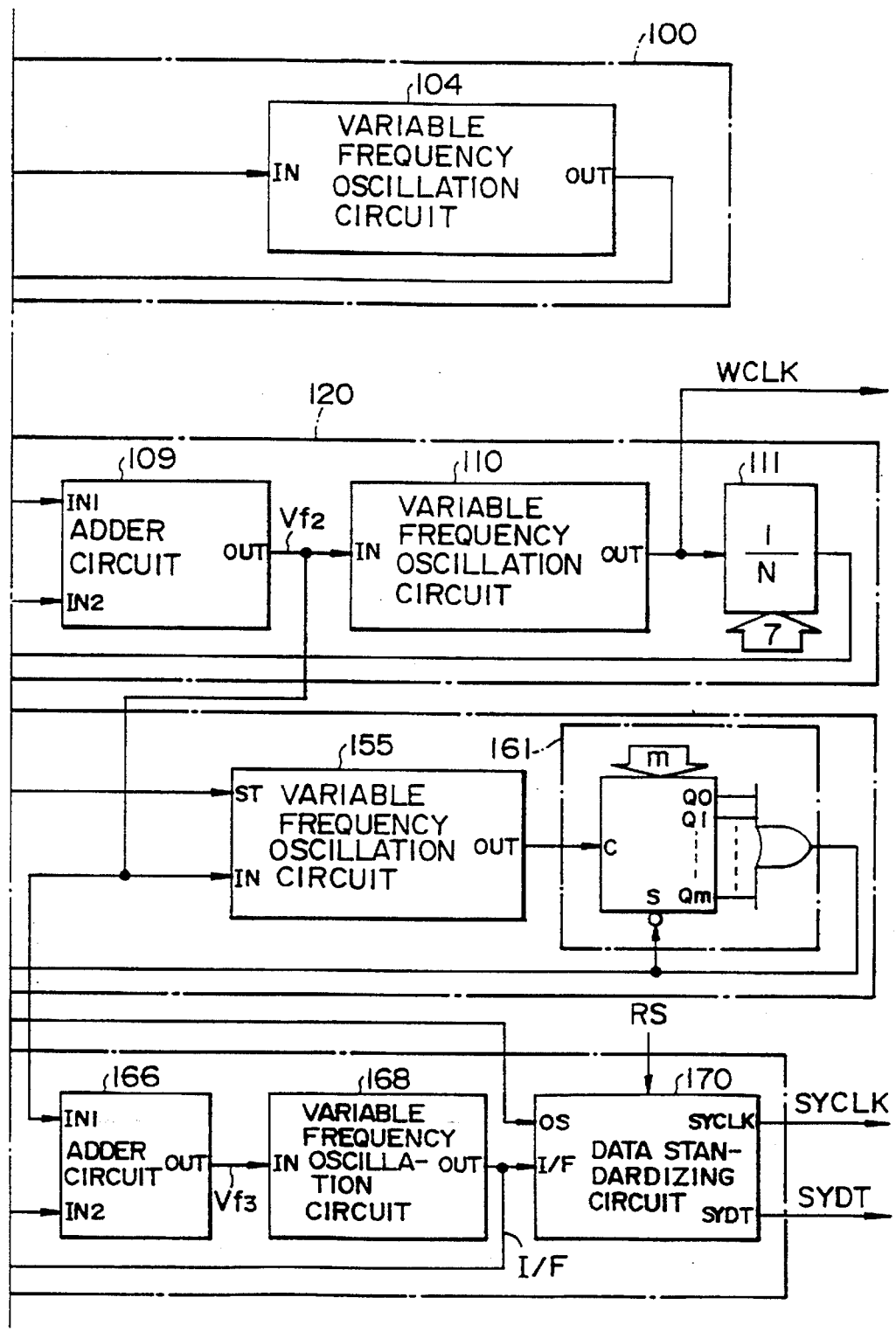

FIGS. 16(a) and 16(b) is a block diagram of a signal processing system according to the third embodiment of the present invention.

Figure 17:
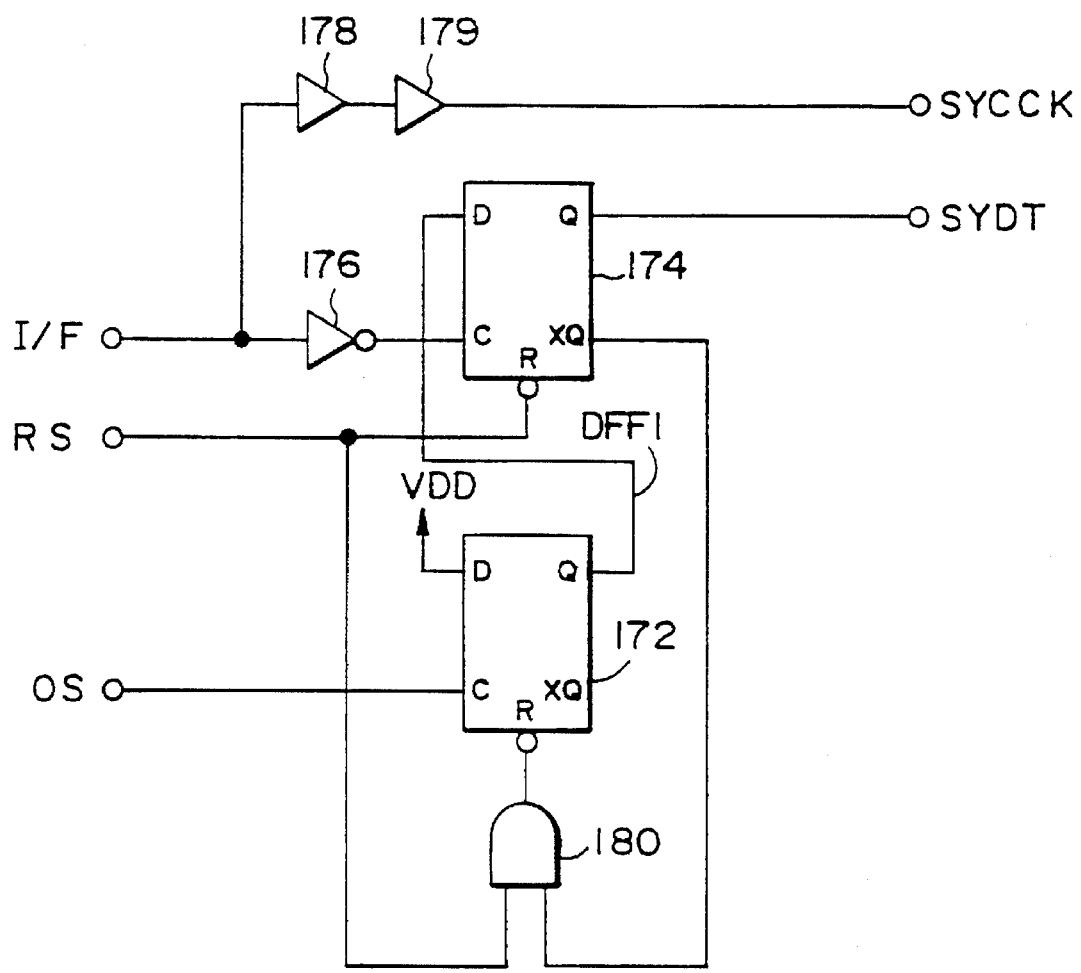

FIG. 17 shows an example of a data standardizing circuit,

FIG. 18 is a timing chart illustrating the operation of the third embodiment.

Figure 19A:
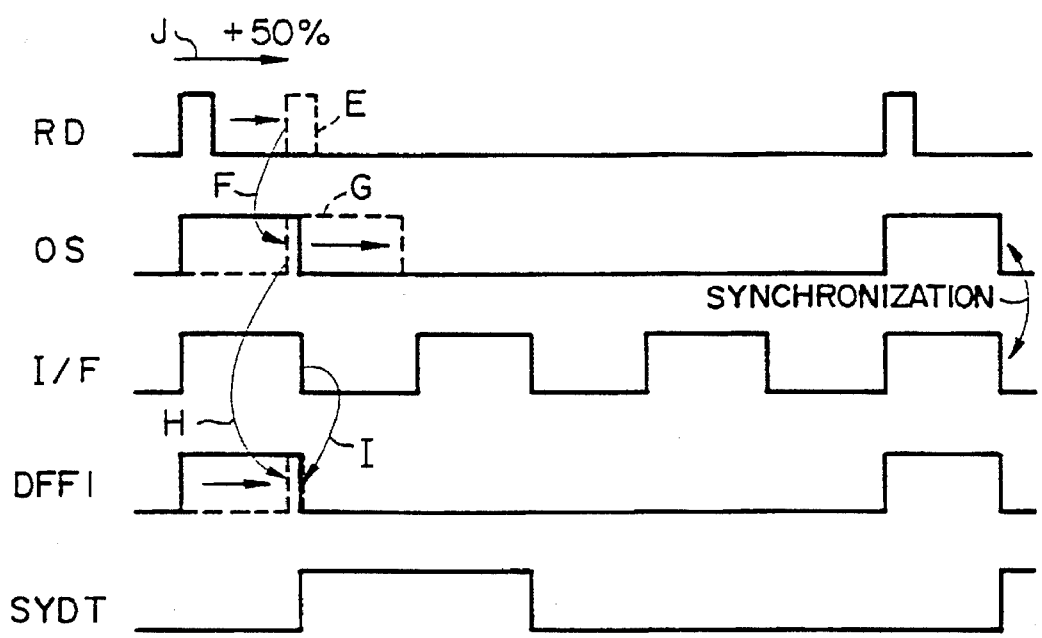
Figure 19B:
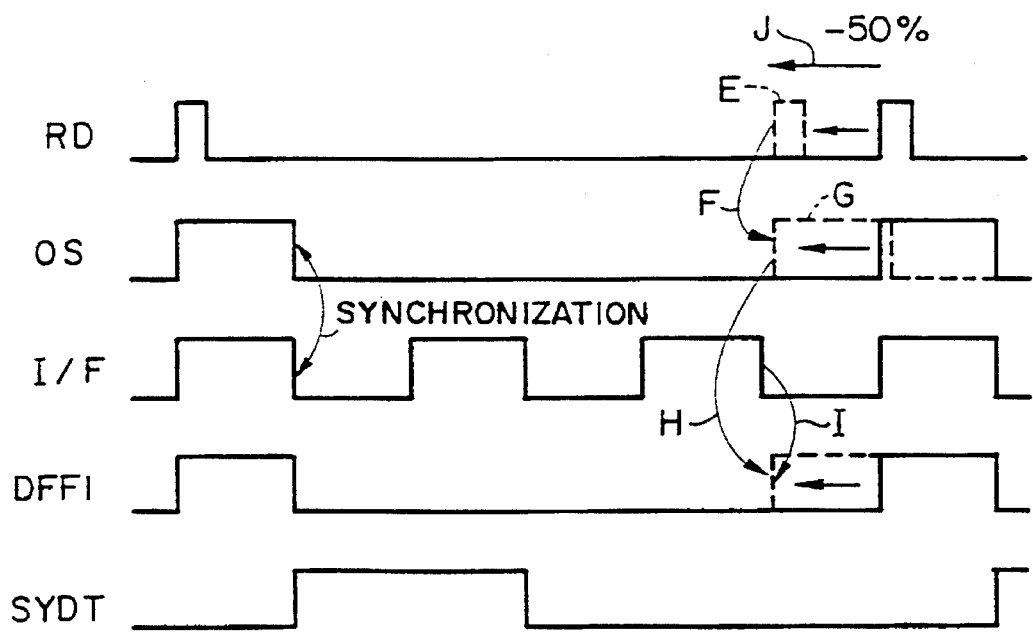

FIGS. 19A and 19B are timing charts illustrating cases where the one-shot pulse width is 50% of the I/F cycle and rightward and leftward peak shifts occur.

Figure 20A:
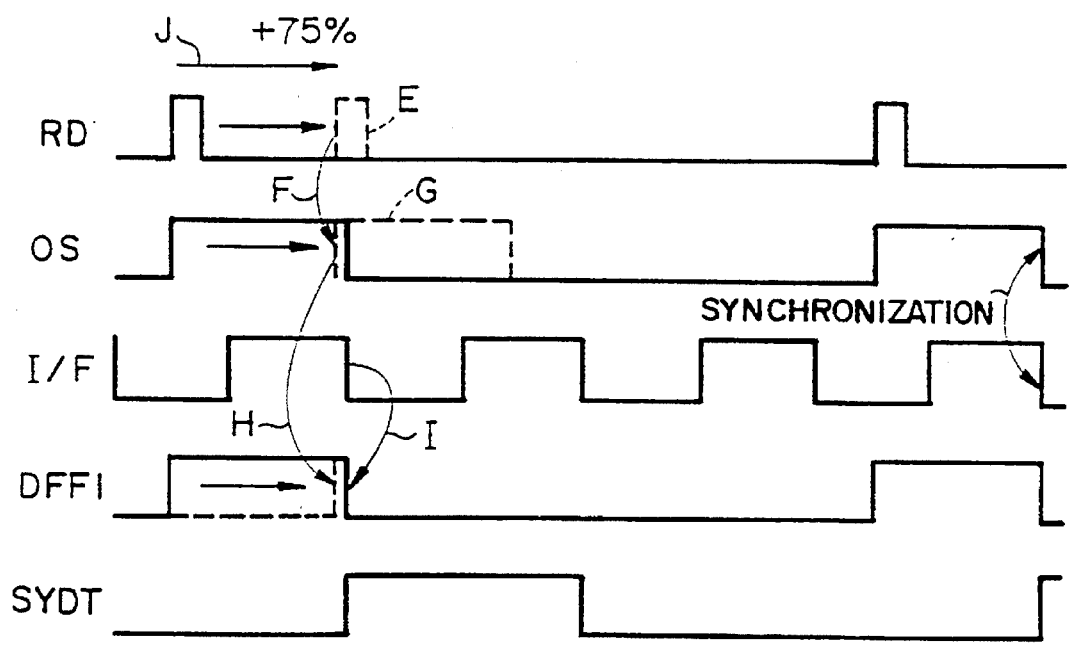
Figure 20B:
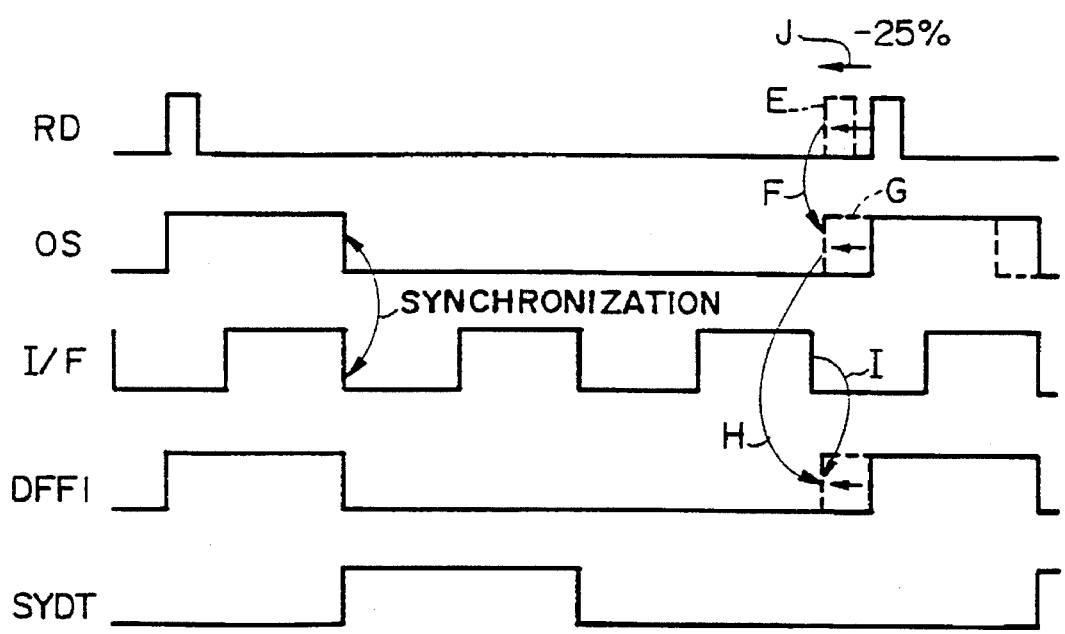

FIGS. 20A and 20B are timing charts illustrating cases where the one-shot pulse width is 75% of the I/F cycle and rightward and leftward peak shifts occur.

Figure 21A:
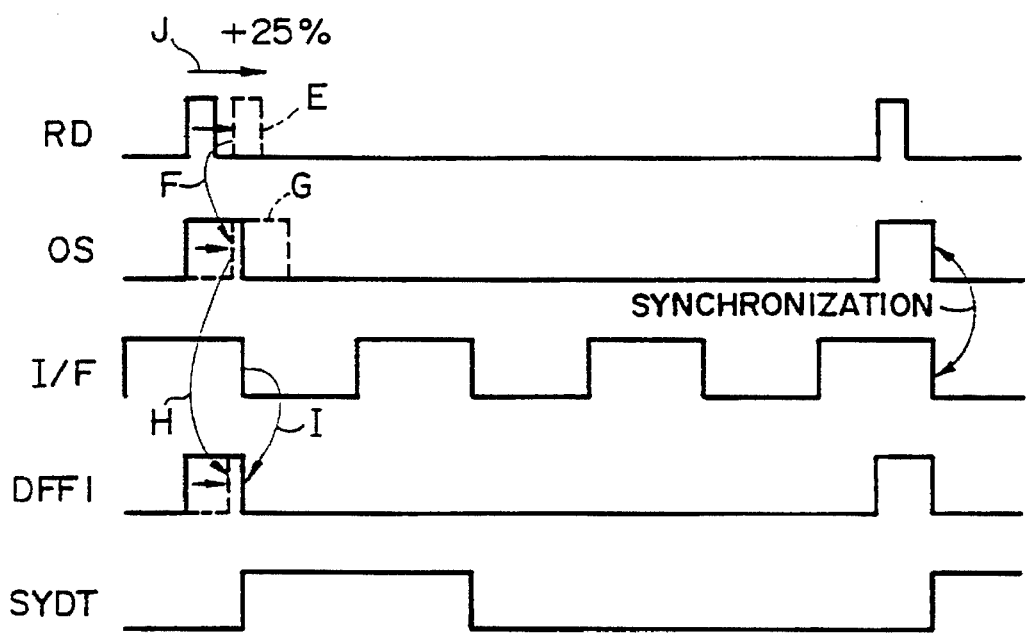
Figure 21B:
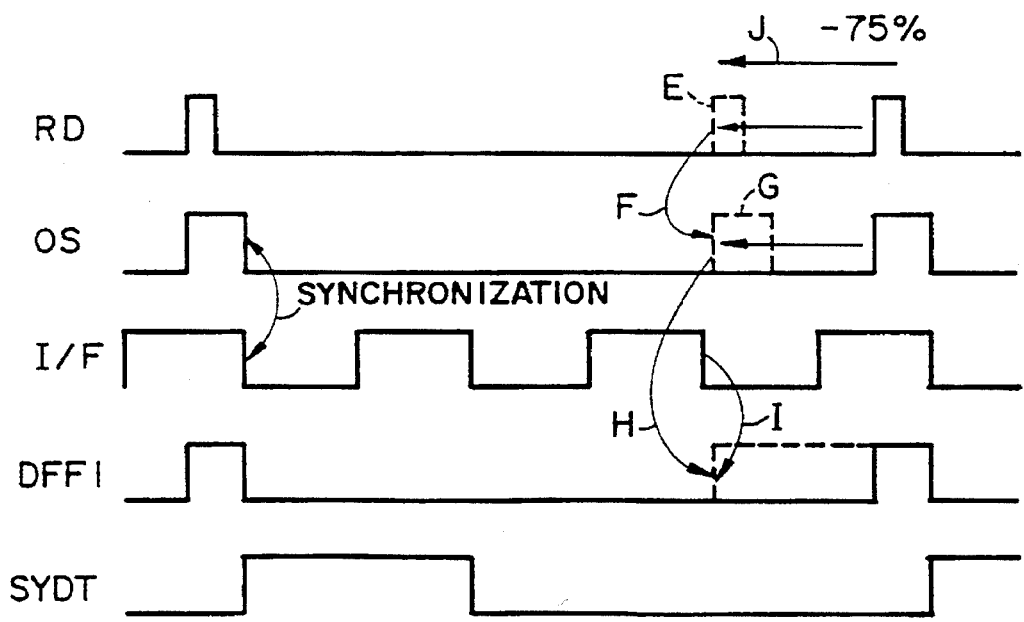

FIGS. 21A and 21B are timing charts illustrating cases where the one-shot pulse width is 25% of the I/F cycle and rightward and leftward peak shifts occur.

Figure 22:
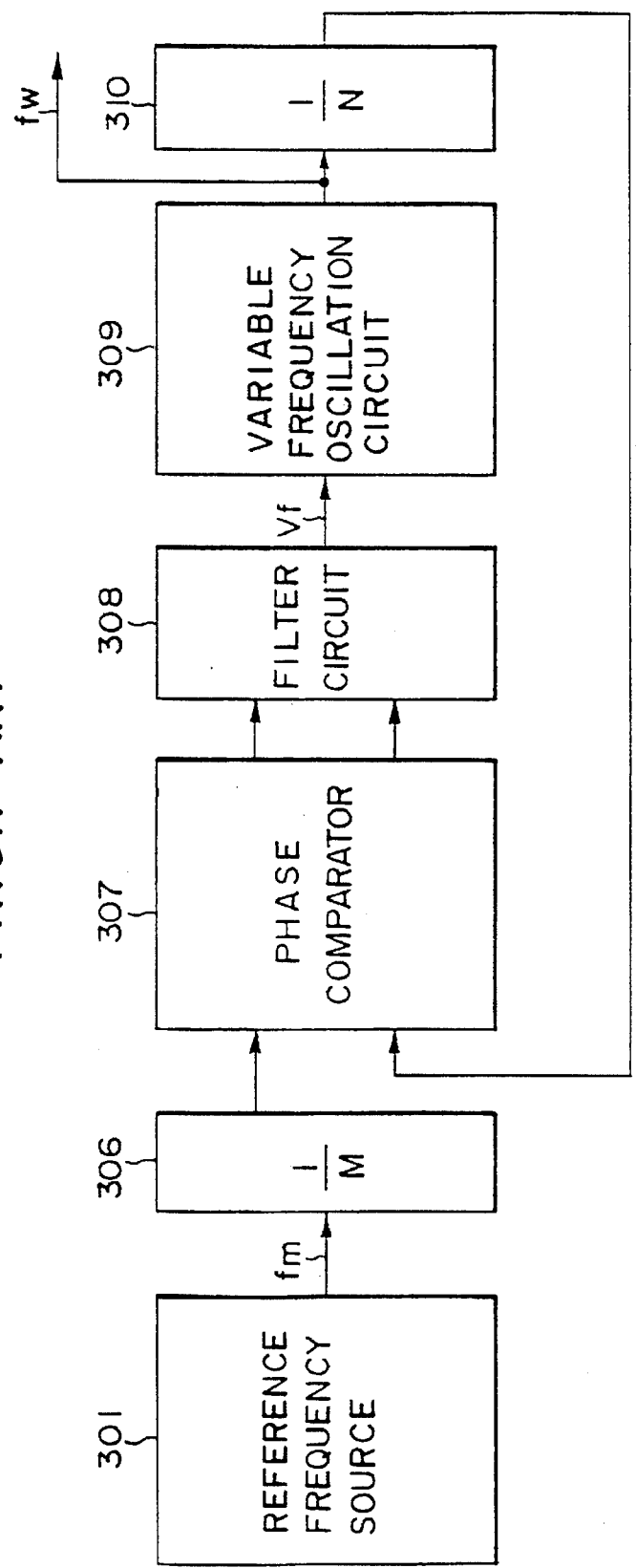

FIG. 22 shows a phase synchronization circuit according to the prior art.

Figure 23:
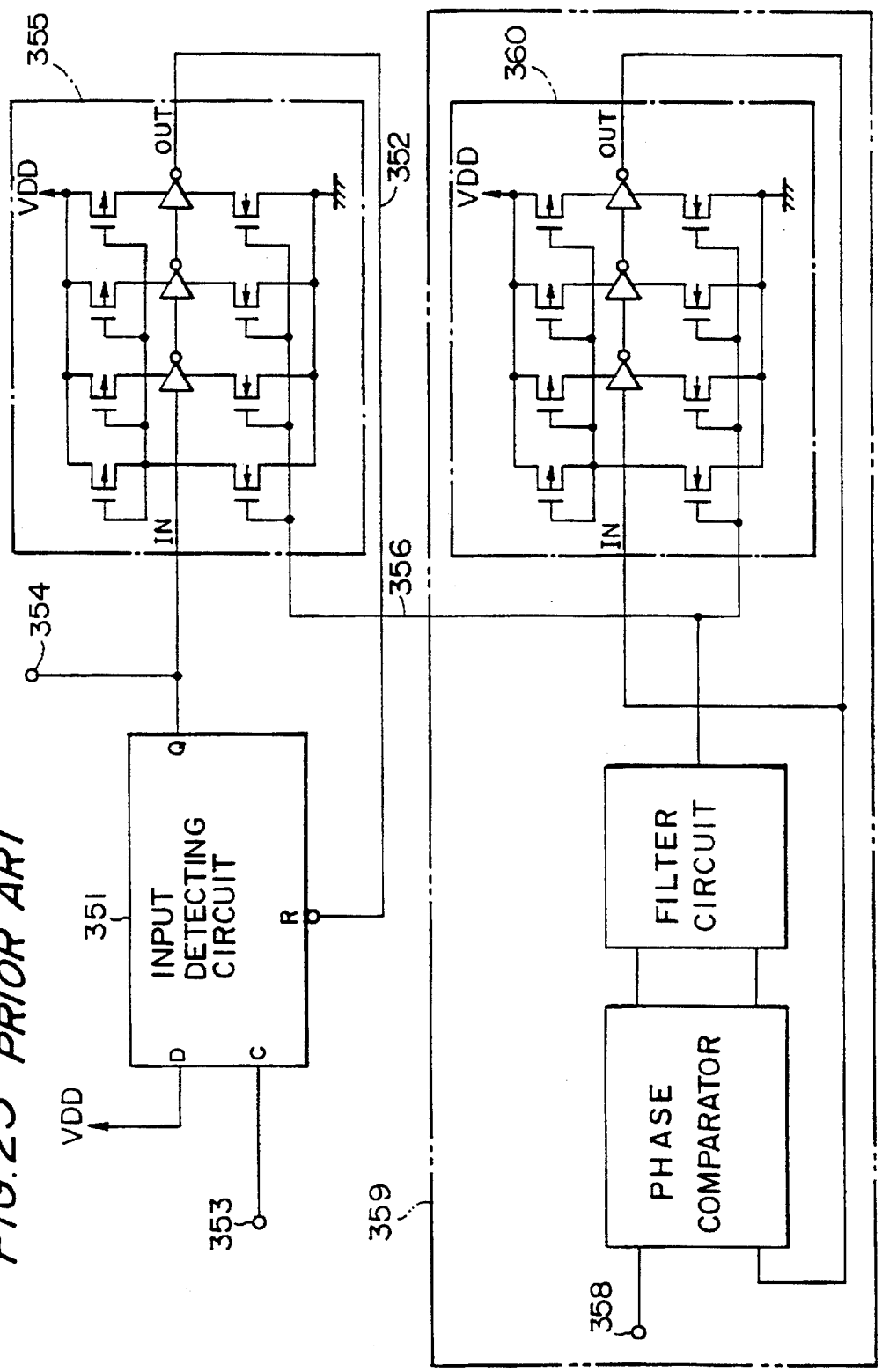

FIG. 23 shows a one-shot circuit according to the prior art.

Figure 24:
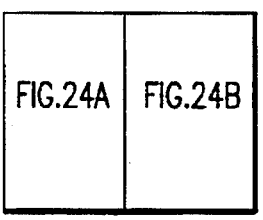
Figure 24A:
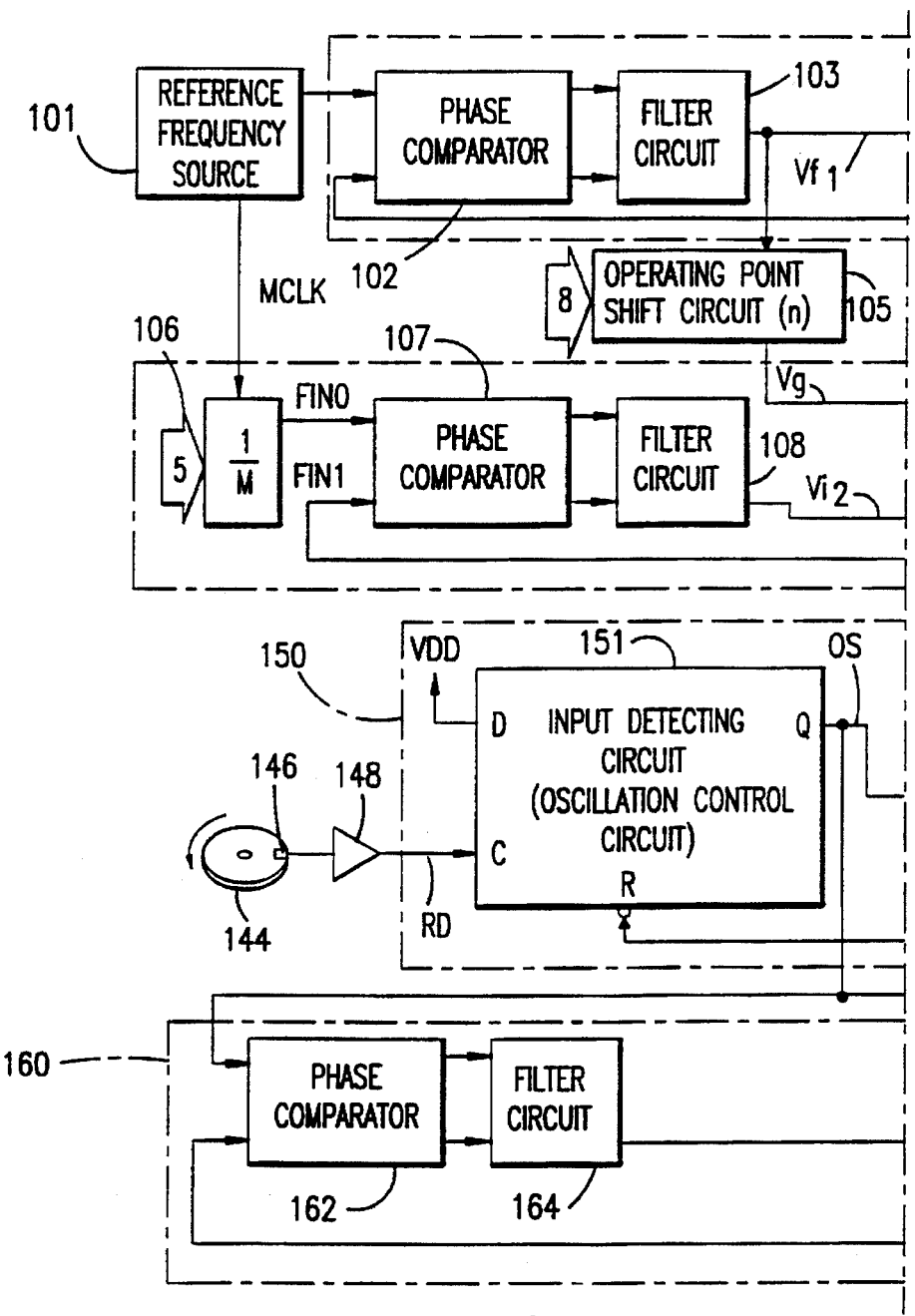
Figure 24B:
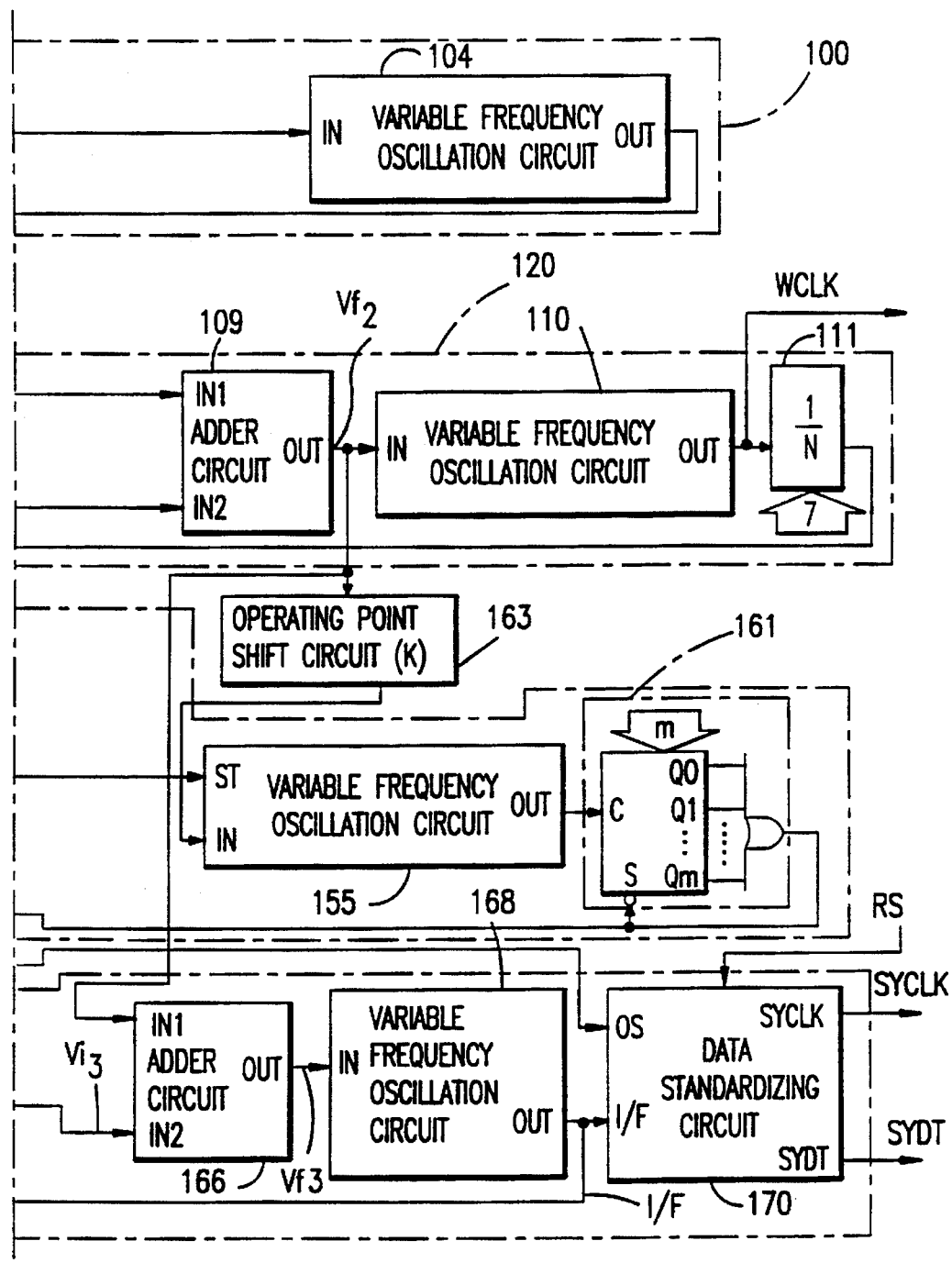

FIGS. 24(a) and 24(b) show block diagram of a signal processing system according to another embodiment of the present invention.

DETAILED DESCRIPTION OF THE PREFERRED EMBODIMENTS

1. First Embodiment

Figure 1:
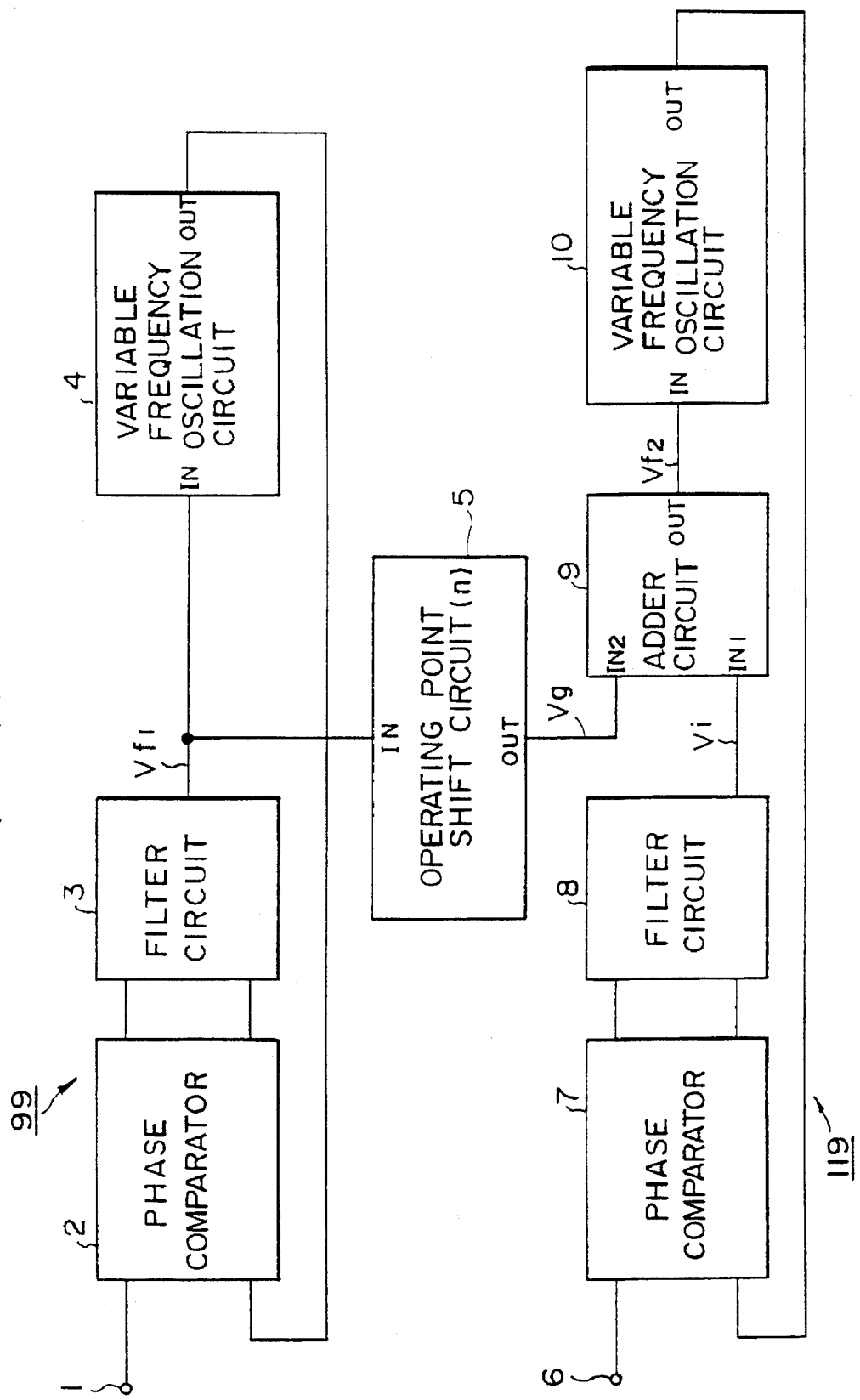
Figure 2B:
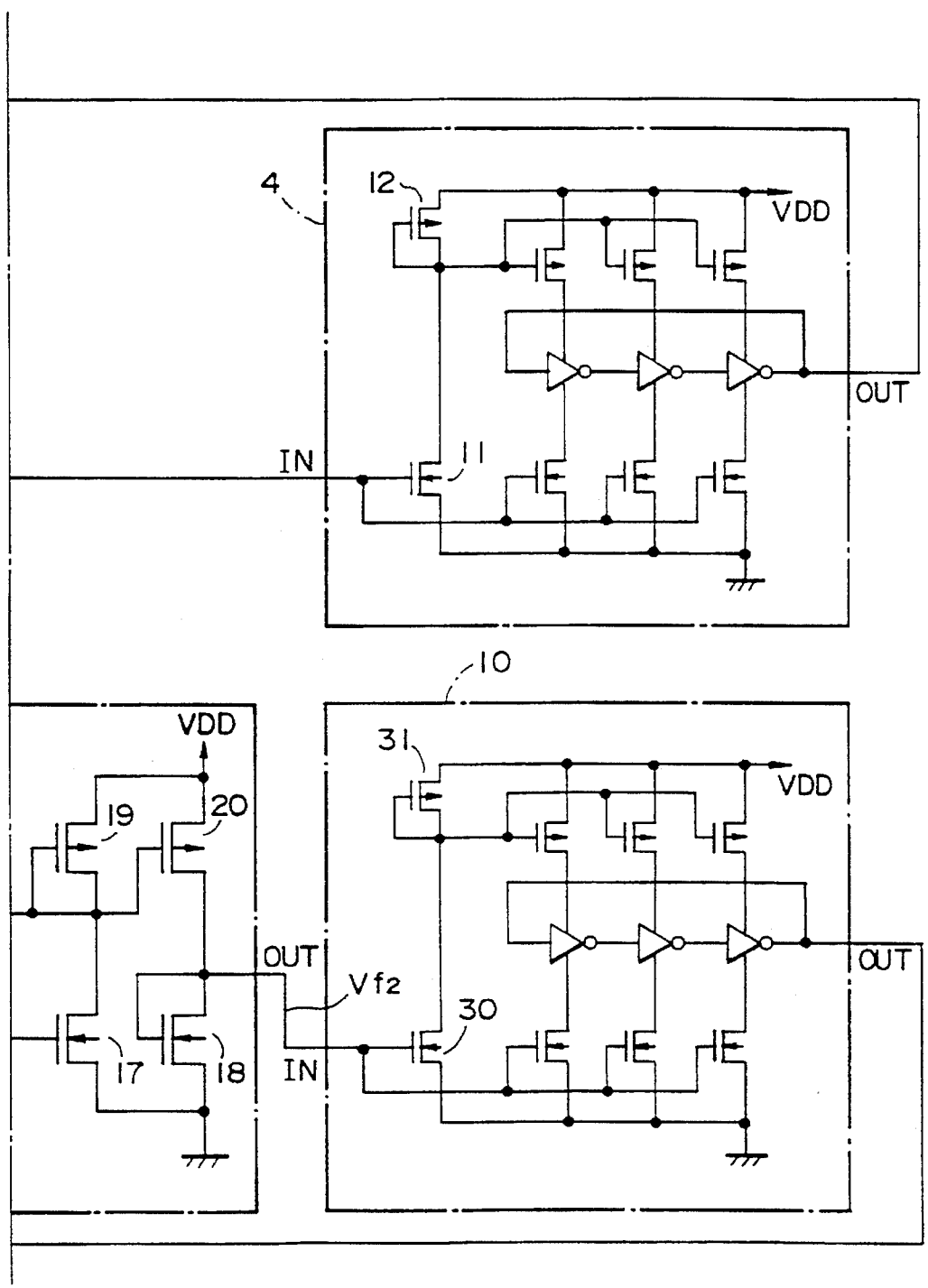
Figure 3:
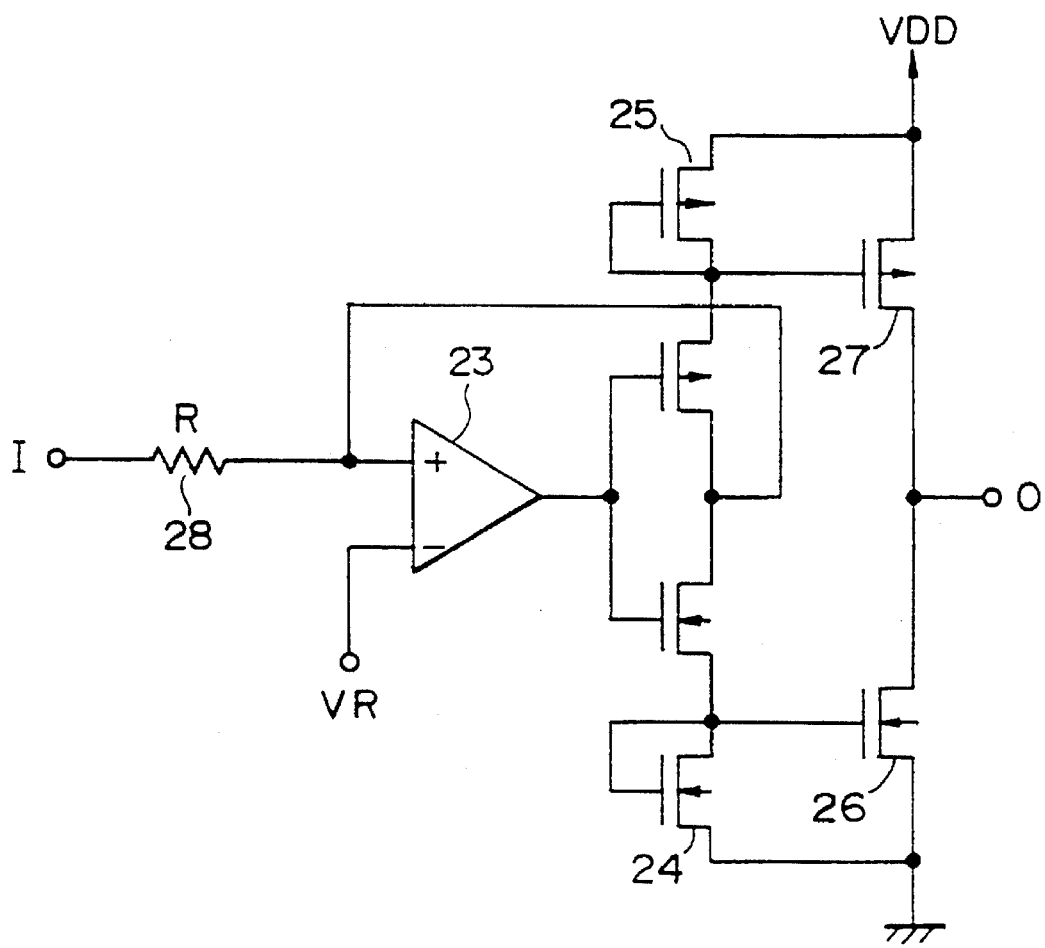
FIG. 3 shows an example of a voltage/current converter.

The first embodiment of the present invention is described in connection with a phase synchronization circuit. FIG. 1 is a block diagram of the first embodiment while FIG. 2 is a circuit diagram showing the details of the circuits which comprise each circuit. As shown in FIG. 1, the phase synchronization circuit according to the first embodiment comprises first and second phase synchronization circuits 99, 119 and an operating point shift circuit 5. The first phase synchronization circuit 99 receives a reference frequency signal 1 and includes a phase comparator 2, a filter circuit 3 and a variable frequency oscillation circuit 4. The second phase synchronization circuit 119 receives an input signal 6 and includes a phase comparator 7, a filter circuit 8, an adder circuit 9 and a variable frequency oscillation circuit 10. The variable frequency oscillation circuit 4 has the same structure and characteristics as those of the variable frequency oscillation circuit 10. FIG. 2 shows an example of ring oscillators defining the variable frequency oscillation circuits 4 and 10.

It is now assumed that the first phase synchronization circuit 99 is stable in synchronism with the reference frequency signal 1 under its phase frequency pull-in effect. An oscillation control signal Vf1 is inputted into the variable frequency oscillation circuit 4 and also into the operating point shift circuit 5. An operating point shift signal Vg, which is the output of the operating point shift circuit 5, is inputted into the input terminal IN2 of the adder circuit 9. FIG. 2 shows an example of the structures of the operating point shift circuit 5.

As shown in FIG. 2, the operating point shift circuit 5 comprises transistors 13, 14, 15 and 16 which perform the operating point shift by changing the ratio of current supply capacities between these transistors 13, 14, 15 and 16. It is now assumed, for example, that the transistors 13 and 14 have the same physical size to provide an equal current supply capacity and that the transistor 16 has such a physical size that its current supply capacity is n times of that of the transistor 15. The current supply capacity of the transistor 13 is set to be equal to those of the transistors 11 and 30 in the variable frequency oscillation circuits 4 and 10. The current supply capacity of the transistor 15 is set to be equal to those of the transistors 12 and 13 in the variable frequency oscillation circuits 4 and 10. Thus, the oscillation control signal Vf1, which is the input of the variable frequency oscillation circuit 4, is inputted into the gate of the transistor 13 so that the current flowing in the transistor 15 becomes equal to that flowing in the transistor 11 of the variable frequency oscillation circuit 4. It is well known that the oscillation frequency of such a variable frequency oscillation circuit (ring oscillator) as shown in FIG. 2 is proportional to the current flowing in the transistor 11. Since the current flowing in the transistor 13 is equal to that of the transistor 15, a voltage determined by this current generates at the gate terminal of the transistor 15. The gate terminal of the transistor 15 is connected to that of the transistor 16, so that a current n times of that of the transistor 15 flows in the transistor 16 under the current mirror effect. Since the current in the transistor 16 is equal to that of the transistor 14, the gate terminal of the transistor 16, that is, the output terminal of the operating point shift circuit 5 receives an operating point shift signal Vg capable of setting the current of the transistor 11 of the variable frequency oscillation circuit 4 multiplied by n. This operating point shift signal Vg can also set the current of the transistor 30 of the variable frequency oscillation circuit 10 multiplied by n.

When it is assumed that the proportional coefficient of the current i flowing in the transistors 11 and 30 of the variable frequency oscillation circuits 4 and 10 to the oscillation frequency f is a, the value f can be given by:

$$f = a \times i \quad (1)$$

When it is assumed that the oscillation frequency of the variable frequency oscillation circuit 4 is f0 and the current flowing in the transistor 11 of the variable frequency oscillation circuit 4 is i0, the value f0 can be represented from the equation (1) as follows:

$$f0 = a \times i0 \quad (2)$$

Thus, the operating point shift circuit 5 outputs a voltage giving $n \times i0$, that is, a voltage giving $n \times f0$.

Such operating point shift circuit 5 can be of a very simplified circuit layout for shifting the operating point, in comparison with an operating point shift circuit using a voltage multiplier and multiplying D/A converter, which will be described later. Therefore, such operating point shift circuit 5 is very advantageous in that the system can be reduced in size.

As shown in FIG. 2, the addition circuit 9 comprises a voltage/current converter 29 and transistors 17, 18, 19 and 20. The voltage/current converter 29 of the addition circuit 9 generates a current corresponding to a voltage difference between an input voltage IN2 and VDD/2. The output current of the voltage/current converter 29 is added to the current of the transistor 17 determined by the voltage of the operating point shift signal Vg. A current determined by the result of addition is duplicated (mirrored) at the transistor 20 under the current mirror effect. The duplicated current determines the gate voltage of the transistor 18 which is in turn outputted therefrom as an oscillation control signal Vf2.

FIG. 8 shows an example of such voltage/current converger 29. The voltage/current converter 29 comprises an operational amplifier 23, a resistor 28, transistors 24, 25, 26 and 27 and other parts. It is assumed that the transistors 24 and 28 have an equal current supply capacity while the transistors 25 and 27 also have an equal current supply capacity. All the current flowing through the resistor 28 flows to VDD or Earth through the transistor 24 or 25. Since the operational amplifier 23 is negatively fed back, it functions so that the inverted input terminal voltage becomes equal to the non-inverted input terminal voltage. Thus, the voltage of the resistor 28 at its right end becomes the VR terminal voltage (in this case, VDD/2), As a result, a current (opposite in polarity to each other) corresponding to the voltage difference between the voltage of the input terminal I and VDD/2 flows in the resistor 28 according to Ohm's law. Such current is equal to a difference between the current of the transistor 24 and the current of the transistor 25. The transistors 26 and 27 are connected to the gates of the respective transistors 24 and 25. As a result, O terminal, which is the output of the voltage/current converter 29, outputs a current equal in absolute value, but opposite in polarity to the current flowing in the resistor 28 by current mirror effect between the transistors 24,25 and the transistors 26,27. The voltage/current conversion coefficient at this time is given by $-1/R$ where the resistance in the resistor 28 is R.

In the addition circuit 9 of FIG. 2, it is now assumed that each of the transistors 17 and 18 has its current supply capacity equal to that of the transistors 11 and 30 in the variable frequency oscillation circuits 4 and 10 and that each of the transistors 19 and 20 has its current supply capacity equal to that of the transistors 12 and 13 in the variable frequency oscillation circuits 4 and 10. When it is assumed herein that the output current of the voltage/current converter 29 is Io and the input voltage of the same is Vi, the voltage/current conversion coefficient is given by the following equation since it is −R as described.

$$Io=-\{Vi-(VDD/2)\}/R \qquad (3)$$

When the voltage Vi is now VDD/2, it is apparent from the above equation (3) that the output current Io of the voltage/current converter 29 becomes zero. In such a case, the current flowing in the transistor 19 is equal to that in the transistor 17. Since the gate terminal of the transistor 17 has received the operating point shift signal Vg from the operating point shift circuit 5, a current n times of that in the transistor 11 in the variable frequency oscillation circuit 4 flows in the transistor 17. As a result, from the equations (1) and (2), the oscillation control signal Vf2 being the output of the addition circuit 9 becomes a signal capable of setting the oscillation frequency of the variable frequency oscillation circuit 10 at a level n times of that of the variable frequency oscillation circuit 4.

Although the second phase synchronization circuit 119 is constructed to be synchronized with the input signal 6, the above operation can easily set the center oscillation frequency of the variable frequency oscillation circuit 10 of the second phase synchronization circuit 119 even if the oscillation frequency of the variable frequency oscillation circuit 4 is different from the center oscillation frequency of the variable frequency oscillation circuit 10. As the output voltage Vi of the filter circuit 8 varies about VDD/2, it is added to the output Vg of the operating point shift circuit 5 by the addition circuit 9. The oscillation frequency of the variable frequency oscillation circuit 10 then varies about the center oscillation frequency. Thus, the variable frequency oscillation circuit 10 functions as an oscillator for the second phase synchronization circuit 119. As a result, the second phase synchronization circuit 119 is synchronized with the input signal 6.

Since the variable frequency oscillation circuits 4 and 10 are of the same structure and characteristics, they maintain the same oscillating current to oscillation frequency characteristics irrespective of variabilities in production, power supply voltage, ambient temperature and other factors. Even if the oscillating current to oscillation frequency characteristics vary due to any influences, such a relationship in which the center oscillation frequency of one of the variable frequency oscillation circuits is n times of the oscillation frequency of the other variable frequency oscillation circuit is never disturbed. When a very accurate and stable frequency from a crystal oscillator or the like is inputted as the reference frequency signal 1, even if the desired oscillation frequency is different from the reference frequency, a high-accuracy and high-stability phase synchronization circuit can be realized without making adjustments irrespective of variabilities in production, power supply voltage, ambient temperature and other factors.

Figure 4:
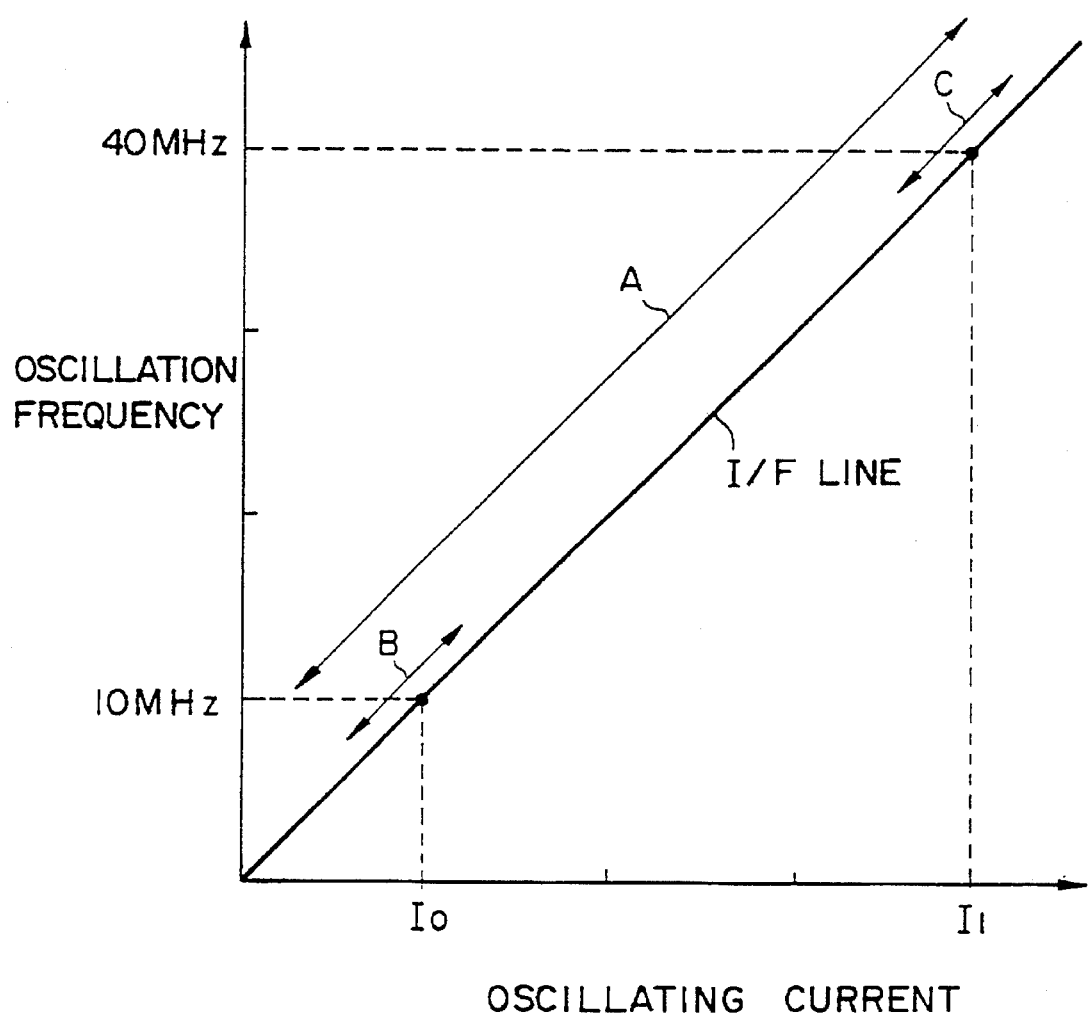
FIG. 4 is a characteristic graph illustrating an example of the relationship between the oscillating current and oscillation frequency in a variable frequency oscillation circuit.

According to this embodiment, a phase synchronization circuit without a tendency to unlock and to increase the jitter due to noises or the like can be realized. FIG. 4 is a characteristic graph illustrating the relationship between the oscillating current and the oscillation frequency in a variable frequency oscillation circuit. As it is apparent from FIG. 4, such phase synchronization circuit as shown in FIG. 22 must vary its oscillating current within a range shown by A in FIG. 4 to cause the second phase synchronization circuit to be synchronized with an oscillation frequency ranging between 10 MHz and 40 MHz, for example. Since the oscillating output voltages of the filter and adder circuits are limited within a range, it is difficult to vary the oscillating current in a wide range (Io–I1) as shown in FIG. 4. To accommodate the phase synchronization circuit of the prior art to such a wide variable frequency range, it is required to increase the proportional coefficient of oscillating current to oscillation frequency (i.e., to increase the gradient of the I/F line in FIG. 4). When the proportional coefficient of oscillating current to oscillation frequency is increased in such a manner, however, the variable frequency oscillation circuit then tends to be unlocked or to increase the jitter due to noises or the like, leading to an unstable phase synchronization. On the contrary, this embodiment is only required to vary the oscillating current relative to the oscillation frequency of 10 MHz within such a range as shown by B in FIG. 4 or relative to the oscillation frequency of 40 MHz within a range shown by C in FIG. 4 since an offset current is previously added to the oscillating current by the operating point shift circuit 5. Therefore, the range of output voltage of the filter and adder circuits 8, 9 are not severely limited. The variable frequency oscillation circuit 10 does not require very large proportional coefficient of oscillating current to oscillation frequency. As a result, a phase synchronization circuit which does not tend to be unlocked due to noises or the like can be provided.

Although it is described in this embodiment that the current supply capacities of the transistors 13 and 15 are respectively equal to those of the transistors 11 and 12 for simplicity, the operation of the operating point shift circuit stays invariable when the transistors are in their proportional relationship with the same proportional constant. Although it is described that the transistors (17 and 18; 19 and 20) respectively have the same current supply capacities as those of the transistors 11 and 12, the adder circuit stays invariable in operation when the transistors are in their proportional relationship with the same proportional constant.

Figure 5:
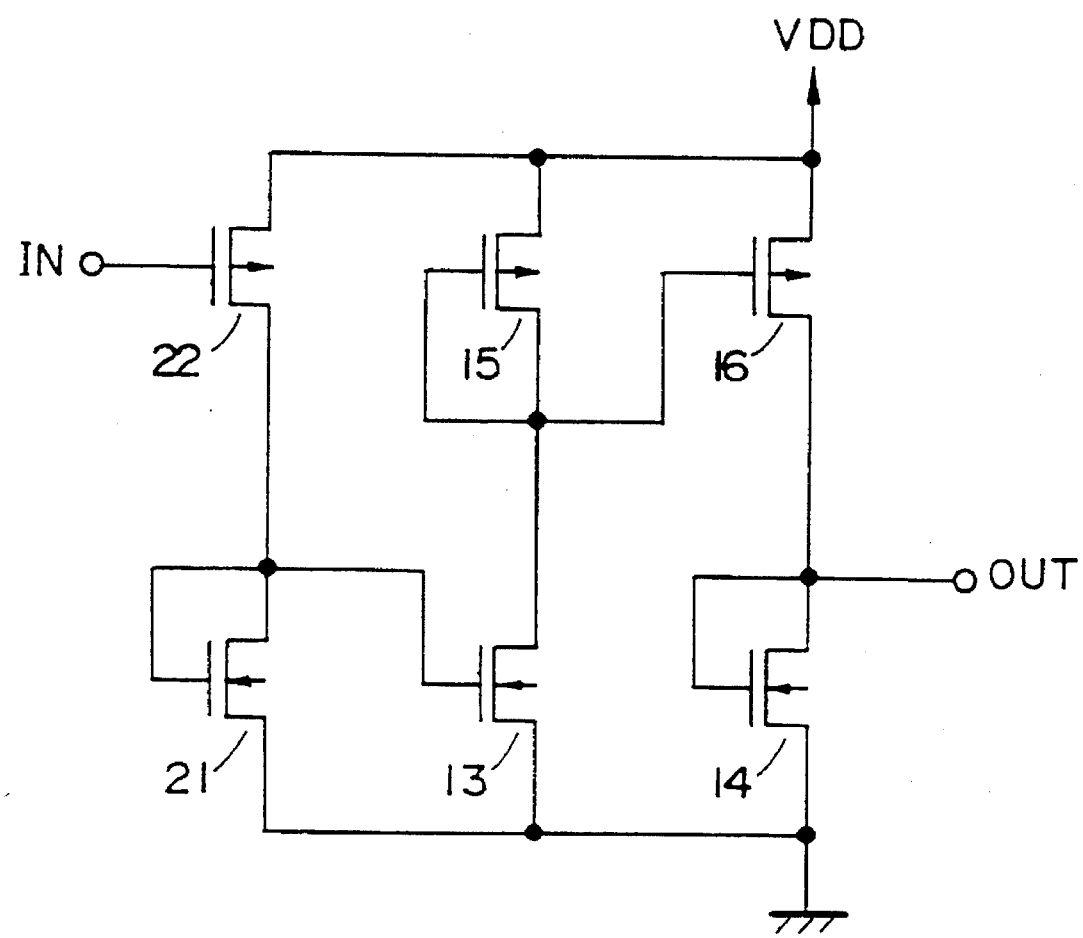
FIG. 5 shows another operating point shift circuit.

Although it is described in this embodiment that the gate terminal of the transistor 11 in the variable frequency oscillation circuit 4 is connected to the IN terminal of the operating point shift circuit 5, the present invention is not limited to such a connection. The gate terminal of the transistor 12 in the variable frequency oscillation circuit 4 can be connected to the IN terminal of the operating point shift circuit 5. In such a case, the operating point shift circuit may be of such an arrangement as shown in FIG. 5. The transistors (13 and 21; 15 and 22) may have the same current supply capacity. Alternatively, these transistors may be arranged to be in the proportional relationship with an equal proportional constant. Then, the current flowing in the transistor 22 is equal to that of the transistor 12 or duplicated (mirrored) in the transistor 22 with a proportional constant. All the current of the transistor 22 flows to the transistor 21 and determines a voltage which is generated at the gate terminal of the transistor 21. As a result, the gate voltage of the transistor 21 is equal to that of the transistor 11. The subsequent procedure is similar to that of the operating point shift circuit.

FIG. 6 shows another operating point shift circuit 205 which is provided with means for controlling the magnification of current/current conversion n (real number) at any level. As shown in FIG. 6, the operating point shift circuit 205 comprises switch circuits 221 to 230 and transistors 231 to 239, 240, 242 and 244. FIG. 7 shows an example of these switch circuits 221 to 230. The Switch circuit comprises an inverter 245, a transmission gate including transistors 246 and 248 and a transistor 250. The switch circuit also comprises an IN terminal receiving the oscillation control signal Vf1 from the filter circuit 3, and an SW terminal receiving any one of eight control signal bits. For example, when the control signal bit 0 becomes "1", the SW terminal of the switch circuit 221 becomes H-level to make the transmission gate of the switch circuit 221 conductive. The signal Vf1 is transmitted to the gate terminal of the switch circuit 221. On the other hand, when the bit 0 becomes "0", the SW terminal of the switch circuit 221 becomes L-level to make the transmission gate of the switch circuit 221 non-conductive, so that the signal Vf1 is not transmitted to the gate terminal of the transistor 231. By shifting the control signal bits 0–7 to "1" or "0" in the same manner, it can be controlled whether or not the transmitted to the gate terminals of the transistors 231 to 239. The current supply capacities of the transistors 231 to 239 may be weighed in a ratio of 1:2:4:8:16:32:64:128, for example. Thus, the magnification of current/current conversion n can be varied by 256 steps.

By providing means for controlling the magnification of current/current conversion n at any level, this embodiment can generate clocks of any frequency corresponding to each zone in the zone bit recording. The system can be improved in general purpose. In the characteristic graph of oscillating current to oscillation frequency shown in FIG. 4, it appears that the I/F line passes through the origin. Actually, however, the I/F line may not pass through the origin due to any error. There is also a case where the I/F line is non-linear. In either case, an error occurs in the aforementioned equation (1), f=a×i. However, such an error can be compensated by adjusting the value of the magnification n. When it is assumed, for example, that the frequency of the reference frequency signal inputted into the first phase synchronization circuit 99 is fm, and the frequency of the input signal into the second phase synchronization circuit 119 is c×fm. Assuming that the I/F line of the variable frequency oscillation circuit does not pass through the origin, this embodiment sets the value n different from the value c, and not equal to the value c. Thus, even if the I/F line does not pass through the origin, the second phase synchronization circuit 119 can output clocks of frequency precisely equal to c×m.

Although the transistors 231 to 239 are arranged separately in FIG. 6, the present invention is not limited to such an arrangement. The transistors 240, 242 and 244 can be arranged separately.

In this embodiment, the variable frequency oscillation circuit is described in terms of a so-called I/F type variable frequency oscillation circuit. As shown in FIGS. 8A and 8B, however, the present invention may be applied to V/F type variable frequency oscillation circuits 33 and 34 in which the input voltage is proportional to the oscillation frequency. In such case, the operating point shift circuit may be formed by a voltage multiplier 36, multiplying D/A converter 38 and others while the adder circuit may be defined by a voltage addition circuit 32 and others.

FIG. 9A shows an example of the voltage multiplier 36 which comprises an analog multiplier 254 for multiplying a signal VY obtained from an eight-bit D/A converter 252 by an input signal VX to form an output.

FIG. 9B shows an example of the multiplying D/A converter 38 which comprises an eight-bit R-2R ladder D/A converter 256 and operational amplifiers 258 and 260 for buffering or amplifying the converted data from the D/A converter 256 to provide an output. In such case, an inversion type operational amplifier must amplify the output since the R-2R ladder D/A converter 256 divides the voltage through a resistor to form a current output. It is thus difficult to realize such circuit with a single 5 V power supply. In order to form a circuit with a single 5 V power supply, such circuit shown in FIG. 9C is required. The circuit uses a reverse R-2R ladder 262 using the input of R-2R ladder D/A converter as an output or the output of the same as an input. This may be in the form of a series resistor including a simple tap-and-switch mechanism. Eight-bit data selects a tap to which a non-inversion type operational amplifier 264 is connected, and whereby providing a desired output.

FIG. 10A shows an example of the voltage addition circuit 32 which comprises operational amplifiers 266 and 268. The structure is not further described as it is well-known in the art. When circuit is actuated with a single 5 V power supply, the circuit must include such a non-inversion type operational amplifier 270 as shown in FIG. 10B.

2. Second Embodiment

The second embodiment relates to a one-shot circuit. FIG. 11 is a block diagram of the second embodiment while FIG. 12 shows the details of the circuit shown in FIG. 11. As shown in FIG. 11, the one-shot circuit relating to the second embodiment comprises an input detecting circuit 51, a variable frequency oscillation circuit 55, an edge detecting circuit 61 and a phase synchronization circuit 59. The input detecting circuit 51 also functions as an oscillation control circuit. FIG. 12 also shows the variable frequency oscillation circuit 55 formed by a ring oscillator. ST denotes an oscillation start/stop control terminal. In the case of FIG. 12, the oscillation is stopped when the input voltage into the ST terminal is at L-level, so that the output Va of the variable frequency oscillation circuit 55 is fixed at H-level. On the other hand, when the input voltage into the ST terminal is H-level, the oscillation starts. From this point of time, the output voltage Va repeatedly shifts from H-level to L-level vice versa to perform the oscillation at every one-half of the oscillation cycle. The oscillation frequency is determined by the voltage at the oscillation frequency control terminal IN. The terminal IN is commonly connected to the terminal IN of a variable frequency oscillation circuit 60 in the phase synchronization circuit 59 by the signal Vf2. As shown in FIG. 12, the variable frequency oscillation circuits 55 and 60 are of the same structure and then oscillate with the same frequency in response to the same oscillation control signal Vf2. The output Va of the variable frequency oscillation circuit 55 is inputted into the clock terminal of the edge detecting circuit 61 which includes an N-ary asynchronous preset down counter.

It is now assumed that the phase synchronization circuit 59 is stable in synchronism with the reference frequency signal As the rising input of the input signal 53 is detected by the edge detecting circuit 51, the output of the input detecting circuit 51 rises to H-level. Since the output of the input detecting circuit (oscillation control circuit) 51 is connected to the oscillation start/stop control terminalST, the variable frequency oscillation circuit 55 starts the oscillation as it receives the output of the input detecting circuit 51. When the edge detecting circuit 61 counts the rising edge of the output Va N times, the edge detecting circuit 61 generates an output Vb of L-level to preset itself. The preset edge detecting circuit 81 tends to return the output Vb to H-level to restart the counting. Nevertheless, since the output Vb of the edge detecting circuit 61 is inputted into the reset terminal of the input detecting circuit 51, the oscillation start/stop control terminalST becomes L-level to stop the oscillation and the counting in the edge detecting circuit 61. Therefore, the input detecting circuit 51, variable frequency oscillation circuit 55 and edge detecting circuit 61 wait until the rising edge of he input signal 53 again detected.

Each time the rising edge of the input signal 53 is detected, a series of such operations are repeated to provide a desired one-shot pulse output 54 at the output of the input detecting circuit 51. When the desired one-shot pulse width is relatively long, this can easily be treated only by increasing the preset value m of the edge detecting circuit 61. This means that merely a logic circuit can accommodate to the desired pulse width, and also that the occupied area can greatly be reduced In comparison with the prior art.

FIG. 13 shows a timing chart in a case where m=5 and where the rising edge of the output Va is detected. As shown in FIG. 13, the rising edge of the input signal 53 makes the one-shot pulse output 54 H-level (see E of FIG. 13). At a point of time when the rising edge of the output Va of the variable frequency oscillation circuit 55 is counted five times, the output Vb of the edge detecting circuit 61 becomes L-level (see F), and the one-shot pulse output 54 also becomes L-level (see G).

In a case where m=1 and where the falling edge of the output Va from the variable frequency oscillation circuit 55 is detected, the edge detecting circuit 61 can be canceled with the output Va of the variable frequency oscillation circuit 55 being inputted directly into the reset terminal of the input detecting circuit 51, so that the input detecting circuit 51 can also function as an edge detecting circuit. When m=1 and the rising edge of the output Va from the variable frequency oscillation circuit 55 is detected, the output Va of the variable frequency oscillation circuit 55 outputs a negative pulse at each time when an input signal is detected by the input detecting circuit 51. The variable frequency oscillation circuit 55 stops the oscillation. In such case, therefore, the output of the variable frequency oscillation circuit 55 can be a one-shot pulse output.

Since the variable frequency oscillation circuits 55 and 60 are of the same structure, the oscillation frequency of the variable frequency oscillation circuit 55 is equal to that of the variable frequency oscillation circuit 60. The oscillation frequency of the variable frequency oscillation circuit 60 also becomes equal to the frequency of the reference frequency signal 58. When the one-shot circuit of this embodiment is formed on an integrated circuit, the identical oscillation characteristics can easily be obtained by arranging the two variable frequency oscillation circuits in the same physical pattern. Thus, the one-shot pulse width can be highly stabilized with an improved accuracy irrespective of variabilities in production, power supply voltage and ambient temperature when a crystal oscillator and the like having very high frequency accuracy and stability is used as the reference frequency signal 58 in this embodiment.

In this embodiment, both the input detecting circuit 51 and the edge detecting circuit 61 detect signals at the rising edges. Nevertheless, when the inverter circuit is inserted in series into the respective circuits, said circuits 51 and 61 can detect signals at the falling edges.

FIG. 14 is a block diagram of the second embodiment where an operating point shift circuit 63 similar to that of the first embodiment is inserted. In the structure shown in FIGS. 11 and 12, the oscillation frequency control terminal IN of the variable frequency oscillation circuit 55 is connected to that of the variable frequency oscillation circuit 60. However, the arrangement of FIG. 14 is different from the structure of FIGS. 11 and 12 in that the operating point shift circuit 63 is interposed between the terminals IN of the variable frequency oscillation circuits 60 and 55. The remaining respects are identical with those of FIGS. 11 and 12.

As the operating point shift circuit 63 (in which the current/current conversion coefficient is k) is inserted into the circuit, the oscillation frequency of the variable frequency oscillation circuit 55 can be equal to or substantially equal to k times of the oscillation frequency of the variable frequency oscillation circuit 60 (k is a real number), as described in connection with the first embodiment. This is because the oscillating current of the variable frequency oscillation circuit 55 can be k times that of the variable frequency oscillation circuit 60 since the operating point shift circuit 63 is of the same structure as that of the operating point shift circuit 5 described in FIG. 2 in connection with the first embodiment.

When the oscillation frequency of the variable frequency oscillation circuit 55 can be made k times in such a manner, the one-shot pulse width can be set in a resolution k times finer than the resolution for setting the one-shot pulse determined by the frequency of the reference frequency signal 58. This is particularly effective when the determined frequency of the reference frequency signal 58 cannot be changed or when the resolution of one-shot pulse width is to be changed into any level. Since the variable frequency oscillation circuits 55 and 60 have the same structure and characteristics with the relationship between the oscillating current and the oscillation frequency being proportional to each other, the high accuracy and stability similar to those of the embodiments of FIGS. 1 and 2 can be obtained irrespective of variabilities in production, power supply voltage and ambient temperature.

The operating point shift circuit 63 of FIG. 14 may also include means for controlling the magnification of current/current conversion k at any level, as in FIG. 6. Such means can accurately generate one-shot pulses of any width corresponding to clocks in each zone of the zone bit recording, as in the first embodiment. When the I/F line does not pass through the origin or is non-linear, one-shot pulses of desired width can be obtained accurately by the compensation and control through the magnification k. The oscillation cycle of the variable frequency oscillation circuit in the one-shot circuit may be inaccurate immediately after the start of the oscillation, and therefore one-shot pulses of the desired width can not be obtained in some cases. Nevertheless, one-shot pulses of the desired width can accurately be provided the compensation and control through the magnification k. Furthermore, an adjustment called "window centering" may be provided by the compensation and control through the magnification k.

The operating point shift circuit 63 may be in any one of various forms, for example, such as a form as shown in FIG. 5.

Although the variable frequency oscillation circuit is described in terms of a so-called I/F type variable frequency oscillation circuit in this embodiment, the present invention is not limited to such form. V/F type variable frequency oscillation circuits 73 and 74 in which the input voltage is proportional to the oscillation frequency, as shown in FIGS. 15A and 15B can be used. In such case, the operating point shift circuit may be formed by a voltage multiplier 76, a multiplying D/A converter 78 and others, as shown in FIGS. 19A-19C.

3. Third Embodiment

The third embodiment relates to a signal processing system including the phase synchronization circuits of the first embodiment and the one-shot circuit of the second embodiment.

FIG. 16 is a block diagram of a signal processing system constructed in accordance with the third embodiment. As shown in FIG. 16, the signal processing system comprises a reference frequency 101 source, a first phase synchronization circuit 100, an operating point shift circuit 105, a second phase synchronization circuit 120, a one-shot circuit 150 and a third phase synchronization circuit 160. Read-out data RD reproduced from an information storage medium 144 through a head 146 and shaped by a shaper 148 is signal-processed to generate a standardized read-out data SYDT and a read clock SYCLK. The output WCLK of the second phase synchronization circuit 120 may be used as write clock to the information storage medium.

The first phase synchronization circuit 100 comprises a phase comparator 102, a filter circuit 103 and a variable frequency oscillation circuit 104 and is of the same structure as that of the first phase synchronization circuit in the first embodiment shown in FIGS. 1 and 2. The operating point shift circuit 105 can set the magnification of current/current conversion n at any level by eight control signal bits, and is of the same structure as that of the operating point shift circuit shown in FIG. 6. The second phase synchronization circuit 120 comprises a phase comparator 107, a filter circuit 108, an adder circuit 109 and a variable frequency oscillation circuit 110. The second phase synchronization circuit 120 is only different from the second phase synchronization circuit of the first embodiment in that the phase synchronization circuit 120 further includes a 1/M divider 108 and a 1/N divider ill. These dividers are to generate clocks of a frequency (N/M) times of the reference frequency. More particularly, since the frequencies of the inputs FIN0 and FIN1 of the phase comparator 107 are equal in FIG. 16, the following equation can be established:

$$fm \times (1/M) = fw \times (1/N) \qquad (4)$$

where the frequencies MCLK and WCLK are fm and fw, respectively.

From the above equation, fw=fm×(N/M), clocks of a frequency (N/M) times of the reference frequency are provided. The operating point shift circuit 105 sets the magnification n equal to or substantially equal to (N/M). Thus, the center oscillation frequency of the variable frequency oscillation circuit 110 can be matched fw to provide a stable oscillation.

The one-shot circuit 150 comprises an input detecting circuit 151, a variable frequency oscillation circuit 155 and an edge detecting circuit, and is of the same structure as that of the one-shot circuit of the second embodiment. The one-shot circuit 150 is responsive to the read-out data RD, and outputs a one-shot pulse OS of a width determined by the oscillation frequency signal Vf2 and the counted number m. The oscillation frequency control terminal IN of the variable frequency oscillation circuit 155 is connected to the terminal IN of the variable frequency oscillation circuit 110, and receives the oscillation control signal Vf2. Thus, the oscillation frequency of the variable frequency oscillation circuit 155 is equal to that of the variable frequency oscillation circuit 110. When the synchronized oscillation frequency of the second variable frequency oscillation circuit 120 is varied by the magnification n in the operating point shift circuit 105 and the division rates (1/M) and (1/N) of the dividers 106 and 111, the one-shot pulse width also varies correspondingly. When the data are read out from an information storage medium in which the data have been stored through the zone bit recording process, the values n, (1/M) and (1/N) are adjusted for every zone. Therefore, depending on the transfer rate of data read out from each zone, the one-shot pulse width can be adjusted to read the zone bit recorded data appropriately.

The third phase synchronization circuit 160 for data separator comprises a phase comparator 162, a filter circuit 164, an addition circuit 166, a variable frequency oscillation circuit 168 and a data standardizing circuit 170. The phase comparator 162 receives a one-shot pulse output OS from the one-shot circuit 150 while the terminal IN1 of the addition circuit 166 receives an oscillation control signal Vf2. Thus, the third phase synchronization circuit 160 is synchronized with the one-shot pulse output OS about the center oscillation frequency which is the oscillation frequencies of the variable frequency oscillation circuits 110 and 155.

FIG. 17 shows am example of the data standardizing circuit 170 which comprises D-flip flops 172, 174, an inverter circuit 176, buffer circuits 178, 179 and an AND circuit 180. Depending on the one-shot pulse output OS and the output I/F of the variable frequency oscillation circuit 168, the data standardizing circuit 170 generates a standardized read-out data SYDT and a read clock SYCLK. RS is a signal for resetting the data Standardizing circuit 170.

FIG. 18 shows a timing chart representing the relationship among the read-out data RD, the one-shot output OS, the output I/F (SYCLK) of the variable frequency oscillation circuit 168, the output DPF1 of the D-flip flop 172 and the standardized read-out data SYDT.

As shown in FIG. 18, the falling edges of OS and I/F are synchronized in phase with each other under the synchronization of the third phase synchronization circuit 160 (see E of FIG. 18). As RD rises, it is detected by the input detecting circuit 151 so that OS becomes H-level and DFF1 also becomes H-level (see F and G). As I/F falls, SYDT being the output of the D-flip flop 174 becomes H-level while at the same time the D-flip flop 172 is reset to make DFF1 L-level (see H and I). The next fall of the I/F makes SYDT L-level (see J). According to this embodiment, thus, SYDT and SYCLK having the rising edge located at the center of the SYDT pulse can be generated (see K).

As shown in FIG. 18, the width of the one-shot pulse output OS is equal to one-half of the I/F, that is, 50% of the cycle so as to secure an appropriate margin relative to the peak shift of the read-out data It is now assumed, for example, that the rightward peak shift occurs as shown by E in FIG. 19A. In such case, the rising edge of the OS also shifts rightward since the OS is made H-level by the rising edge of the RD (see F and G in FIG. 19A). DFF1 becomes H-level by the rising edge of the OS, and also L-level by the falling edge of the I/F (see H and I). Therefore, the rising edge of DFF1 aligns with the falling edge of the I/F results in an output of an erroneous SYDT. Usually, the falling edge of the OS is synchronized with the falling edge of the I/F through the synchronization of the third phase synchronization circuit 160. However, the peak shift has a very high frequency component, in comparison with the variable frequency due to variations of the rotating media. Therefore, the third phase synchronization circuit 160 is usually constructed to have a low responsibility relative to the peak shift so that it does not follow the peak shift. As shown in FIG. 19A, therefore, the I/F does not greatly shift rightward following the peak shift.

For simplicity, it is now assumed that the response of the third phase synchronization circuit 160 following the peak shift is equal to zero (i.e., it does not follow The peak shift). When the width of the one-shot pulse output OS is equal to 50% of the I/F cycle, the rightward peak shift is permitted up to plus 50% of the I/F cycle (see J of FIG. 19A). Considering the delay value in the logic circuit such as D-flip lied or the like, however, the margin of the peak shift is actually smaller than plus 50%.

FIG. 19B shows the opposite case where the leftward peak shift occurs. When the rising edge of DFF1 (i.e., the rising edge of the OS) becomes identical with the falling edge of the I/F, an erroneous SYDT is outputted (see H and I of FIG. 19B). In other words, when the width of the one-shot pulse output OS is 50% of the I/F cycle, the leftward peak shift is permitted up to minus 50% of the I/F cycle (see J of FIG. 19B).

As it is apparent from the above description, the peak can be permitted to shift within a range between minus 50% and plus 50% when the width of the one-shot pulse output OS is equal to Of the I/F cycle, and ignoring the fact %hat the peak shift is affected by the delay in the logic circuit and/or the followability to the peak shift. The peak shift can occur in both the right and left directions depending on the characteristics of the information storage medium or the like. It is therefore desirable that the signal processing system has the same permissible margin (between minus 50% and plus 50%) relative to the peak shift in both the right and left directions. In this respect, it is desirable that the width of the one-shot pulse output OS is precisely equal to 50% of the I/F cycle under the normal condition. Since the one-shot circuit 150 of this embodiment can more accurately adjust the one-shot pulse width than the prior art one-shot circuit, the one-shot pulse width can be precisely equal to 50% of the I/F cycle. Thus, a signal processing system which does not tend to produce a malfunction relative to the peak shift of read-out data can be realized.

As described, it is desirable that the width of the one-shot pulse output OS is precisely equal to 50% of the I/F cycle under the normal condition. In certain cases, however, the window margin relative to the peak shift or the window center needs to be adjusted. In such cases, inserting such operating point shift circuit as described in connection with FIG. 14 is particularly effective. More particularly, an operating point shift circuit 163 receiving an input oscillation control signal Vf2 is inserted into the forward stage of the variable frequency oscillation circuit 155, as shown in FIGS. 24A and 24B. An operating point shift signal, which is the output of the operating point shift circuit 163 (the magnification of current/current conversion k), is then inputted into the terminal IN of the variable frequency oscillation circuit 155. Thus, the oscillation frequency of the variable frequency oscillation circuit 155 is changed to a level different from the oscillation frequency of the variable frequency oscillation circuit 110. It is, for example, possible that the oscillation is produced with a frequency higher than the oscillation frequency of the variable frequency oscillation circuit 110. The adjustment of oscillation frequency can be accomplished by adjusting the magnification of current/current conversion k in the operating point shift circuit 163. In such manner, the one-shot pulse width canbe adjusted with very high resolution so that the window center can be adjusted with very high accuracy.

FIGS. 20A and 20B show a case where the one-shot pulse width is increased to adjust the window center, and more particularly, where the one-shot pulse width is made 75% of the I/F cycle. In such case, considering the rightward peak shifts occurs as shown in FIG. 20A, an accurate SYDT continues to be outputted until the rising edge of The DFF1 is aligned with the falling edge of the I/F (see H and I in FIG. 20A). Therefore, when the one-shot pulse width is made plus 75% of the I/F cycle, the window margin on the plus side is increased by 25% to become plus 75% (see J of FIG. 20A). On the other hand, as shown in FIG. 20B, considering the leftward peak shift occurs, the window margin on the minus side is decreased by 25% to become minus 25% (see J of FIG. 20B).

When the one-shot pulse width is equal to 75% of the I/F cycle, the window margin ranges between minus 25% and plus 75%. As a result, the window center can be shifted to the plus side by 25%. In other words, the window center can be shifted or adjusted to the plus side by increasing the one-shot pulse width.

FIGS. 21A and 21B show a case where the one-shot pulse width is equal to 25% of the I/F cycle in order to adjust the window center. Considering the rightward peak shift occurs as shown in FIG. 21A, the window margin on the plus side decreases by 25% to become plus 25% (see J of FIG. 21A). On the other hand, considering the leftward peak shift occurs as shown in FIG. 21B, the window margin on the minus side increases by 25% to become minus 75% (see J of FIG. 21B).

When the one-shot pulse width is equal to 25% of the I/F cycle, the window margin ranges between minus 75% and plus 25%. As a result, the window center can be shifted by 25% to the minus side. In other words, the window center can be shifted or adjusted to the minus side by decreasing the one-shot pulse width.

According to this embodiment, the window center can be adjusted by adjusting the one-shot pulse width. This enables the window margin throughout the whole data readout system to be tested. Information storage medium in which the rightward or leftward peak shift tends to occur exists. In such case, this embodiment can effectively prevent an incorrectly readout data by varying the one-shot pulse width to shift the window center to the plus or minus side depending on the characteristics of the information storage medium.

It is to be understood that the present invention is not limited to the aforementioned embodiments, but may be carried out with various modifications and changes within the scope of the invention.

For example, the variable frequency oscillation means, operating point shift means, adder means, input detecting means (oscillation control means), edge detecting means or data standardizing means are not limited to those of the aforementioned embodiments, but may be any one of all the other forms if it has a similar function.

It is natural that the phase synchronization circuit, one-shot circuit and signal processing system according to the present invention may be applied to the readout of read only information storage media such as CD-ROM and others, and the write/read of information storage media such as hard discs, magneto-optical discs and others.

I claim:

1. A phase synchronization circuit comprising first phase synchronization means synchronized with a reference frequency signal, second phase synchronization means synchronized with an input signal and an operating point shift means, said first phase synchronization means including first phase comparing means for performing the phase comparison for synchronization with said reference frequency signal, first filter means connected to the first phase comparing means for generating a first oscillation control signal, and first variable frequency oscillation means responsive to a current or voltage set by said first oscillation control signal for controlling the oscillation frequency thereof, said operating point shift means being responsive to said first oscillation control signal to generate an operating point shift signal, said second phase synchronization means including second phase comparing means for performing the phase comparison for synchronization with said input signal, second filter means connected to said second phase comparing means, adder means including first and second addition input terminals into which said operating point shift signal and the output of said second filter means are respectively inputted to generate a second oscillation control signal under the current or voltage addition and a second variable frequency oscillation means responsive to a current or voltage set by said second oscillation control signal, wherein the operating point shift signal causes the oscillation frequency of the second variable frequency oscillation means to be n times the oscillation frequency of the first variable frequency oscillation means.

2. A one-shot pulse generating circuit as defined in claim 1 wherein said operating point shift means includes means for controlling said magnification k at any level.

3. A one-shot pulse generating circuit comprising oscillation control means, first variable frequency oscillation means, edge detecting means and phase synchronization means having second variable frequency oscillation means of the same structure as that of said first variable frequency oscillation means and being synchronized with a reference frequency, said one-shot pulse generating circuit being operative to generate a one-shot pulse at an output terminal of said oscillation control means or first variable frequency oscillation means, said phase synchronization means generating an oscillation control signal, said edge detecting means being operative to output a detection signal after the rising or falling edge of an output signal from the first variable frequency oscillation means has been counted m times, said oscillation control means being operative to output an oscillation start signal toward the first variable frequency oscillation means when the oscillation control means receives an input signal, and to output an oscillation stop signal toward said first variable frequency oscillation means when said oscillation control means receives said detection signal from said edge detecting means, said first variable frequency oscillation means including an oscillation start/stop control terminal and an oscillation frequency control terminal, the oscillation being started when said oscillation start signal is inputted into said oscillation start/stop control terminal, the frequency of said oscillation being controlled in response to the oscillation control signal of said phase synchronization means inputted into said oscillation frequency control terminal, and the oscillation being stopped when said oscillation stop signal is inputted into said oscillation start/stop control terminal.

4. A one-shot pulse generating circuit as defined in claim 3, further comprising operating point shift means responsive to the oscillation control signal of said phase synchronization means to generate an operating point shift signal, the operating point shift signal causing an oscillation frequency of the first variable frequency oscillation means to be k times an oscillation frequency of the second variable frequency oscillation means, the operating point shift signal being then outputted from said operating point shift means toward the oscillation frequency control terminal of said first variable frequency oscillation means.

5. A one-shot pulse generating circuit as defined in claim 4 wherein said one-shot pulse is used for a data standardizing means to generate standardized data from said input signal, and a width of the one-shot pulse is controlled through the counted number m or a combination of the counted number m with the magnification k to adjust a range in which the data standardizing means generates correct standardized data.

6. A one-shot pulse generating circuit as defined in claim 3 wherein said one-shot pulse is used for a data standardizing means to generate standardized data from said input signal, and a width of the one-shot pulse is controlled through the counted number m to adjust a range in which the data standardizing means generates correct standardized data.

7. A phase synchronization circuit as defined in claim 1 wherein said operating point shift means includes control means for controlling the magnification n at any level.

8. A one-shot pulse generating circuit as defined in claim 5 wherein said one-shot pulse is used for a data standardizing means to generate standardized data from said input signal, and a width of the one-shot pulse is controlled through the counted number m or a combination of the counted number m with the magnification k to adjust a range in which the data standardizing means generates correct standardized data.

9. A signal processing system comprising first phase synchronization means synchronized with a reference frequency signal, second phase synchronization means synchronized with a clock signal set on the reference frequency signal, first operating point shift means, one-shot pulse generating means including oscillation control means for detecting the presence or absence of data read out from an information medium, fourth variable frequency oscillation means and edge detecting means, and third phase synchronization means for data separator, said first phase synchronization means comprising first phase comparing means for performing the phase comparison for synchronization with the reference frequency signal, first filter means connected to the first phase comparing means for generating a first oscillation control signal, and first variable frequency oscillation means responsive to a current or voltage set by the first oscillation control signal to control the oscillation frequency thereof, said first operating point shift means being responsive to said first oscillation control signal to generate a first operating point shift signal, said second phase synchronization means comprising second phase comparing means for performing the phase comparison for synchronization with the clock signal, second filter means connected to the second phase comparing means, first adder means including first and second addition input terminals into which the first operating point shift signal and the output of the second filter means are respectively inputted to generate a second oscillation control signal by the current or voltage addition, and second variable frequency oscillation means responsive to the current or voltage set by the second oscillation control signal to control the oscillation frequency thereof, said edge detecting means included in said one-shot pulse generating means being operative to output a detection signal after the rising or falling edge of the output signal from the fourth variable frequency oscillation means has been counted m times, said oscillation control means included in said one-shot pulse generating means being operative to output an oscillation start signal toward the fourth variable frequency oscillation means when the read data is detected and also to output an oscillation stop signal toward the fourth variable frequency oscillation means when the detection signal is inputted into the oscillation control means from the edge detecting means, the fourth variable frequency oscillation means included in said one-shot pulse generating means having an oscillation start/stop control terminal and an oscillation frequency control terminal, the oscillation being started when the oscillation start signal is inputted into the oscillation start/stop control terminal, the frequency of said oscillation being controlled in response to the second oscillation control signal of the second variable frequency oscillation means inputted into the oscillation frequency control terminal, and the oscillation being stopped when the oscillation stop signal is inputted into the oscillation start/stop control terminal, the third phase synchronization means for data separator comprising third phase comparing means for performing the phase comparison for synchronization with the one-shot pulse output of said one-shot pulse generating means, third filter means connected to the third phase comparing means, adder means including first and second addition input terminals into which the second oscillation control signal and the output of the third filter means are respectively inputted to generate a third oscillation control signal by the current or voltage addition, third variable frequency oscillation means for controlling the oscillation frequency thereof in response to a current or voltage set by the third oscillation control signal, and data standardizing means for generating standardized read-out data based on the one-shot pulse and the output of the third variable frequency oscillation means, wherein the first operating point shift signal causes the oscillation frequency of the second variable frequency oscillation means to be n times the oscillation frequency of the first variable frequency oscillation means.

10. A signal processing system as defined in claim 9, further comprising second operating point shift means responsive to the second oscillation control signal of said second phase synchronization means to generate a second operating point shift signal, the second operating point shift signal causing the oscillation frequency of the fourth variable frequency oscillation means to be k times the oscillation frequency of the second variable frequency oscillation means, the second operating point shift signal being then outputted from said second operating point shift means toward the oscillation frequency control terminal of said fourth variable frequency oscillation means in said one-shot pulse generating means.

11. A signal processing system as defined in claim 9 wherein said first operating point shift means includes control means for controlling said magnification n at any level.

12. A signal processing system as defined in claim 10 wherein said first and second operating point shift means include control means for controlling the magnifications n and k at any levels.

13. A signal processing system as defined in claim 9 wherein a width of the outputted one-shot pulse is controlled through the counted number m to adjust a range in which the data standardizing means generates correct standardized data.

14. A signal processing system as defined in claim 10 wherein a width of the outputted one-shot pulse is controlled through the counted number m or a combination of the counted number m with the magnification k to adjust a range in which the data standardizing means generates correct standardized data.

15. A signal processing system as defined in claim 11 wherein a width of the outputted one-shot pulse is controlled through the counted number m or a combination of the counted number m with the magnification k to adjust a range in which the data standardizing means generates correct standardized data.

16. A signal processing system as defined in claim 12 wherein a width of the outputted one-shot pulse is controlled through the counted number m or a combination of the counted number m with the magnification k to adjust a range in which the data standardizing means generates correct standardized data.

* * * * *